(12) United States Patent
Gao

(10) Patent No.: US 12,271,073 B2
(45) Date of Patent: Apr. 8, 2025

(54) BACK COVER AND PROCESSING METHOD THEREOF, AND ELECTRONIC DEVICE

(71) Applicant: Honor Device Co., Ltd., Guangdong (CN)

(72) Inventor: Chengjie Gao, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 17/923,140

(22) PCT Filed: Apr. 27, 2022

(86) PCT No.: PCT/CN2022/089608
§ 371 (c)(1),
(2) Date: Nov. 3, 2022

(87) PCT Pub. No.: WO2023/029530
PCT Pub. Date: Mar. 9, 2023

(65) Prior Publication Data
US 2024/0248338 A1     Jul. 25, 2024

(30) Foreign Application Priority Data
Aug. 28, 2021 (CN) .......................... 202110999310.9

(51) Int. Cl.
*G02F 1/1333* (2006.01)
*C23C 14/08* (2006.01)
(Continued)

(52) U.S. Cl.
CPC ...... *G02F 1/133331* (2021.01); *C23C 14/083* (2013.01); *C23C 14/10* (2013.01);
(Continued)

(58) Field of Classification Search
None
See application file for complete search history.

(56) References Cited

U.S. PATENT DOCUMENTS 9,709,868 B2   7/2017   Chung
2017/0060284 A1*   3/2017   Harada ................. C23C 14/352
(Continued)

FOREIGN PATENT DOCUMENTS

CN     106154672 A     11/2016
CN     106255945 A     12/2016
(Continued)

*Primary Examiner* — Shan Liu
(74) *Attorney, Agent, or Firm* — Leydig, Voit & Mayer, Ltd.

(57) ABSTRACT

A back cover and a processing method thereof, and an electronic device are disclosed, which relate to the field of electronic product technologies, so as to resolve a problem that air bubbles may be easily generated between a cover plate and an electrochromic film layer when the electrochromic film layer is laminated to the cover plate. The electronic device includes a back cover, and the back cover includes: a transparent cover plate, the electrochromic film layer, and a shielding part. The electrochromic film layer and the transparent cover plate are laminated. The shielding part is disposed between an edge part of the electrochromic film layer and the transparent cover plate, and a thickness of the shielding part is less than 4 microns.

17 Claims, 9 Drawing Sheets

(51) Int. Cl.
*C23C 14/10* (2006.01)
*C23C 14/14* (2006.01)
*G02F 1/1334* (2006.01)
*G02F 1/1335* (2006.01)

(52) U.S. Cl.
CPC ............ *C23C 14/14* (2013.01); *G02F 1/1334* (2013.01); *G02F 1/133512* (2013.01); *G02F 2201/50* (2013.01)

(56) References Cited

U.S. PATENT DOCUMENTS

| | | | |
|---|---|---|---|
| 2018/0307110 A1 | 10/2018 | Nguyen et al. | |
| 2019/0041712 A1* | 2/2019 | Liu | G02F 1/1525 |
| 2019/0146269 A1* | 5/2019 | Mikumo | G03F 7/0007 |
| | | | 430/7 |
| 2019/0384095 A1* | 12/2019 | Chen | G02F 1/133512 |
| 2021/0124100 A1* | 4/2021 | Kim | B32B 3/30 |

FOREIGN PATENT DOCUMENTS

| | | | | |
|---|---|---|---|---|
| CN | 106483706 A | | 3/2017 | |
| CN | 106950747 A | * | 7/2017 | |
| CN | 109062460 A | | 12/2018 | |
| CN | 109495622 A | | 3/2019 | |
| CN | 209746324 U | | 12/2019 | |
| CN | 110838262 A | * | 2/2020 | ............... G02B 1/18 |
| CN | 110843266 A | | 2/2020 | |
| CN | 111478989 A | | 7/2020 | |
| CN | 112147828 A | | 12/2020 | |
| CN | 112153837 A | | 12/2020 | |
| CN | 112165803 A | * | 1/2021 | |
| CN | 212851364 U | | 3/2021 | |
| CN | 213694464 U | | 7/2021 | |
| KR | 20110053940 A | * | 5/2011 | |

* cited by examiner

BACK COVER AND PROCESSING METHOD THEREOF, AND ELECTRONIC DEVICE

CROSS-REFERENCE TO RELATED APPLICATIONS

This application is a National Stage of International Application No. PCT/CN2022/089608, filed on Apr. 27, 2022, which claims priority to Chinese Patent Application No. 202110999310.9, filed on Aug. 28, 2021, both of which are incorporated by reference herein in their entireties.

TECHNICAL FIELD

This application relates to the field of electronic product technologies, and in particular, to a back over and a processing method thereof, and an electronic device.

BACKGROUND

In a related technology, in an electronic device with a back cover of an electrochromic film layer, an edge of the electrochromic film layer has a cabling region, an encapsulation region, or a discoloration non-uniform region formed due to impact of moisture, oxygen, or the like. To improve an aesthetic appearance of the electronic device, a shielding part configured to shield an edge part of the electrochromic film layer is usually provided at the electrochromic film layer or on a transparent cover plate of the electronic device, so as to prevent the edge part of the electrochromic film layer from being exposed. However, after the shielding part is provided at the electrochromic film layer or on the transparent cover plate, when the electrochromic film layer is laminated to the transparent cover plate, air bubbles may be easily generated between the transparent cover plate and the electrochromic film layer, and consequently, a production yield of the electronic device is reduced.

SUMMARY

Embodiments of this application provide a back cover of an electronic device and a processing method thereof, and an electronic device, to resolve a problem that air bubbles may be easily generated between a cover plate and an electrochromic film layer when the electrochromic film layer is laminated to the cover plate.

To achieve the forgoing objective, embodiments of this application use the following technical solutions.

A first aspect of embodiments of this application provides an electronic device. The electronic device includes a back cover, and the back cover includes: a transparent cover plate, an electrochromic film layer, and a shielding part. The electrochromic film layer and the transparent cover plate are laminated. The shielding part is disposed between an edge part of the electrochromic film layer and the transparent cover plate, and a thickness of the shielding part is less than 4 microns.

In the electronic device provided in this application, by setting the thickness of the shielding part to be less than 4 microns, a layer difference between the electrochromic film layer and the transparent cover plate can be reduced while both a shielding effect of the shielding part and surface smoothness of the shielding part are considered: and further, when the electrochromic film layer is adhered to the transparent cover plate, air bubbles between the electrochromic film layer and the transparent cover plate can be eliminated, so that difficulty of laminating the electrochromic film layer to the transparent cover plate is greatly reduced, thereby improving a production yield. In addition, an overall thickness of the back cover is reduced, thereby facilitating a lightening and thinning design of the electronic device.

In a possible implementation of the first aspect, an orthographic projection that is of the edge part of the electrochromic film layer and that is on the transparent cover plate is located in an orthographic projection that is of the shielding part and that is on the transparent cover plate. In this way, the shielding part can effectively shield the edge part of the electrochromic film layer, to prevent the edge part of the electrochromic film layer from being exposed, thereby improving an aesthetic appearance of the electronic device.

In a possible implementation of the first aspect, the electrochromic film layer further includes a middle portion surrounded by the edge part, and at least a part of an orthographic projection that is of the middle portion and that is on the transparent cover plate does not overlap the orthographic projection that is of the shielding part and that is on the transparent cover plate. In this way, the back cover can show a color of the middle portion, to ensure appearance expression of the back cover.

In a possible implementation of the first aspect, the thickness of the shielding part is less than or equal to 1 micron. In this way, a layer difference between the electrochromic film layer and the transparent cover plate can be further reduced, and further, when the electrochromic film layer is adhered to the transparent cover plate, air bubbles between the electrochromic film layer and the transparent cover plate can be eliminated, so that difficulty of laminating the electrochromic film layer to the transparent cover plate is greatly reduced, thereby improving a production yield. In addition, an overall thickness of the back cover is further reduced, thereby further facilitating a lightening and thinning design of the electronic device.

In a possible implementation of the first aspect, the thickness of the shielding part is greater than or equal to 0.01 micron. In this way, by further limiting the thickness of the shielding part, the thickness of the shielding part is greater than or equal to 0.01 micron, so that the shielding effect of the shielding part can be ensured, and the edge part of the electrochromic film layer is prevented from being exposed. Therefore, a layer difference between the electrochromic film layer and the transparent cover plate can be reduced while a shielding effect of the shielding part is considered, air bubbles between the electrochromic film and the transparent cover plate is eliminated, so that difficulty of laminating the electrochromic film layer to the transparent cover plate is greatly reduced, thereby improving a production yield. In addition, an overall thickness of the back cover is reduced, thereby facilitating a lightening and thinning design of the electronic device.

In a possible implementation of the first aspect, light transmittance of the shielding part ranges from 0 to 50%. In this way, by setting the light transmittance of the shielding part to range from 0 to 50%, the shielding effect of the shielding part can be ensured, and the edge part of the electrochromic film layer is prevented from being exposed.

In a possible implementation of the first aspect, the shielding part is a non-conductive layer. In this way, the shielding part can be prevented from interfering with an antenna signal of the electronic device, thereby improving stability of the antenna signal of the electronic device.

In a possible implementation of the first aspect, resistance of the shielding part is greater than or equal to 5 megohms. In this way, the shielding part can be prevented from interfering with an antenna signal of the electronic device, thereby improving stability of the antenna signal of the electronic device.

In a possible implementation of the first aspect, the shielding part includes a light shielding layer. The light shielding layer includes one or more of an indium layer, an indium alloy layer, and a first interleaved layer including at least two sub-layers of different refractive indexes that are successively and alternately laminated. Therefore, the shielding effect of the shielding part can be ensured while reducing the thickness of the shielding part, and color types of the light shielding layer can be more abundant, so that the shielding part and the back cover can be better integrated.

In a possible implementation of the first aspect, the interleaved layer is a first interleaved layer including a silicon dioxide layer and a titanium dioxide layer that are successively and alternately laminated, a second interleaved layer including a silicon dioxide layer and a niobium oxide layer that are successively and alternately laminated, or a third interleaved layer including a silicon dioxide layer or a tantalum oxide layer that are successively and alternately laminated.

In a possible implementation of the first aspect, both a thickness of the indium layer and a thickness of the indium alloy layer range from 10 nm to 50 nm; and a thickness of the interleaved layer ranges from 200 nm to 1000 nm.

Therefore, by setting the thickness of the indium layer and the thickness of the indium alloy layer to range from 10 nm to 55 nm, the shielding effect of the light shielding layer can be ensured while preventing the light shielding layer from conducting electricity, so that the light shielding layer are opaque and non-conductive, to ensure the shielding effect of the light shielding layer and avoid interference caused by the light shielding layer to the antenna signal of the electronic device. By setting the thickness of the interleaved layer to range from 200 nm to 1000 nm, the shielding effect of the light shielding layer can be ensured while reducing the thickness of the shielding part, and color types of the light shielding layer can be more abundant, so that the shielding part and the back cover can be better integrated.

In a possible implementation of the first aspect, the shielding part is disposed on a surface that is of the transparent cover plate and that faces the electrochromic film layer. The surface of the transparent cover plate is smooth and flat, so that the shielding part can be conveniently disposed on the surface of the transparent cover plate, thereby reducing processing difficulty of the shielding part, and improving processing efficiency and a production yield.

In a possible implementation of the first aspect, the shielding part further includes an underlayer, and the underlayer is disposed between the light shielding layer and the transparent cover plate. The underlayer can improve adherence between the light shielding layer and the transparent cover plate, thereby reducing processing difficulty of the light shielding layer, and effectively preventing the light shielding layer from falling off.

In a possible implementation of the first aspect, the underlayer is a silicon-containing underlayer or a zirconia-containing underlayer. Therefore, the adherence between the light shielding layer and the transparent cover plate can be increased while reducing a thickness of the underlayer, thereby reducing impact of the underlayer on the overall thickness of the shielding part.

In a possible implementation of the first aspect, a thickness of the silicon-containing underlayer ranges from 1 nm to 7 nm, and a thickness of the zirconia-containing underlayer ranges from 5 nm to 30 nm. Therefore, the adherence between the light shielding layer and the transparent cover plate can be increased while reducing a thickness of the underlayer, thereby reducing impact of the underlayer on the overall thickness of the shielding part.

In a possible implementation of the first aspect, the shielding part further includes a protective layer, and the protective layer is disposed on a side that is of the light shielding layer and that is away from the transparent cover plate. The protective layer can protect the light shielding layer, to prevent the light shielding layer from being scratched and falling off.

In a possible implementation of the first aspect, the protective layer is a niobium oxide layer or a titanium oxide layer. The niobium oxide layer and titanium oxide layer have relatively high hardness, so that a protective effect of the protective layer can be improved.

In a possible implementation of the first aspect, a thickness of the protective layer ranges from 10 nm to 35 nm. Therefore, the light shielding layer can be effectively protected by using the protective layer, and impact of the protective layer on the overall thickness of the shielding part can be reduced.

In a possible implementation of the first aspect, the back cover further includes a decoration layer, and the decoration layer is disposed on a side that is of the electrochromic film layer and that is away from the transparent cover plate. Therefore, appearance expression of the back cover can be improved.

In a possible implementation of the first aspect, the decoration layer includes at least one of an optical film layer, a color layer, and a texture layer. Therefore, the back cover can have various light lusters, colors, and texture changes, to improve appearance expression of the back cover.

In a possible implementation of the first aspect, a color difference $\Delta Eab$ between a color of the shielding part and a color of the decoration layer ranges from 0 to 5. Therefore, by controlling the color difference $\Delta Eab$ between the color of the shielding part and the color of the decoration layer to be within 0 to 5, the color of the shielding part and the color of the decoration layer can be substantially the same, thereby improving an aesthetic appearance of the back cover.

In a possible implementation of the first aspect, the electronic device further includes a circuit board. The circuit board is located in the back cover, and the electrochromic film layer and the circuit board are electrically connected.

A second aspect of embodiments of this application provides a back cover. The back cover includes: a transparent cover plate: an electrochromic film layer, and a shielding part. The electrochromic film layer and the transparent cover plate are laminated: and the shielding part is disposed between an edge part of the electrochromic film layer and the transparent cover plate, and a thickness of the shielding part is less than 4 microns.

In the back cover provided in this application, by setting the thickness of the shielding part to be less than 4 microns, a layer difference between the electrochromic film layer and the transparent cover plate can be reduced while both a shielding effect of the shielding part and surface smoothness of the shielding part are considered; and further, when the electrochromic film layer is adhered to the transparent cover plate, air bubbles between the electrochromic film layer and the transparent cover plate can be eliminated, so that difficulty of laminating the electrochromic film layer to the transparent cover plate is greatly reduced, thereby improving a production yield. In addition, an overall thickness of the back cover is reduced, thereby facilitating a lightening and thinning design of the electronic device.

In a possible implementation of the second aspect, an orthographic projection that is of the edge part of the electrochromic film layer and that is on the transparent cover plate is located in an orthographic projection that is of the shielding part and that is on the transparent cover plate. In this way, the shielding part can effectively shield the edge part of the electrochromic film layer, to prevent the edge part of the electrochromic film layer from being exposed, thereby improving an aesthetic appearance of the electronic device.

In a possible implementation of the second aspect, the electrochromic film layer further includes a middle portion surrounded by the edge part, and at least a part of an orthographic projection that is of the middle portion and that is on the transparent cover plate does not overlap the orthographic projection that is of the shielding part and that is on the transparent cover plate. In this way, the back cover can show a color of the middle portion, to ensure appearance expression of the back cover.

In a possible implementation of the second aspect, the thickness of the shielding part is less than or equal to 1 micron. In this way, a layer difference between the electrochromic film layer and the transparent cover plate can be further reduced, and further, when the electrochromic film layer is adhered to the transparent cover plate, air bubbles between the electrochromic film layer and the transparent cover plate can be eliminated, so that difficulty of laminating the electrochromic film layer to the transparent cover plate is greatly reduced, thereby improving a production yield. In addition, an overall thickness of the back cover is further reduced, thereby further facilitating a lightening and thinning design of the electronic device.

In a possible implementation of the second aspect, the thickness of the shielding part is greater than or equal to 0.01 micron. In this way, by further limiting the thickness of the shielding part, the thickness of the shielding part is greater than or equal to 0.01 micron, so that the shielding effect of the shielding part can be ensured, and the edge part of the electrochromic film layer is prevented from being exposed. Therefore, a layer difference between the electrochromic film layer and the transparent cover plate can be reduced while a shielding effect of the shielding part is considered, air bubbles between the electrochromic film and the transparent cover plate is eliminated, so that difficulty of laminating the electrochromic film layer to the transparent cover plate is greatly reduced, thereby improving a production yield. In addition, an overall thickness of the back cover is reduced, thereby facilitating a lightening and thinning design of the electronic device.

In a possible implementation of the second aspect, light transmittance of the shielding part ranges from 0 to 50%. In this way, by setting the light transmittance of the shielding part to range from 0 to 50%, the shielding effect of the shielding part can be ensured, and the edge part of the electrochromic film layer is prevented from being exposed.

In a possible implementation of the second aspect, the shielding part is a non-conductive layer. In this way, the shielding part can be prevented from interfering with an antenna signal of the electronic device, thereby improving stability of the antenna signal of the electronic device.

In a possible implementation of the second aspect, resistance of the shielding part is greater than or equal to 5 megohms. In this way, the shielding part can be prevented from interfering with an antenna signal of the electronic device, thereby improving stability of the antenna signal of the electronic device.

In a possible implementation of the second aspect, the shielding part includes a light shielding layer. The light shielding layer includes one or more of an indium layer, an indium alloy layer, and a first interleaved layer including at least two sub-layers of different refractive indexes that are successively and alternately laminated. Therefore, the shielding effect of the shielding part can be ensured while reducing the thickness of the shielding part, and color types of the light shielding layer can be more abundant, so that the shielding part and the back cover can be better integrated.

In a possible implementation of the second aspect, the interleaved layer is a first interleaved layer including a silicon dioxide layer and a titanium dioxide layer that are successively and alternately laminated, a second interleaved layer including a silicon dioxide layer and a niobium oxide layer that are successively and alternately laminated, or a third interleaved layer including a silicon dioxide layer or a tantalum oxide layer that are successively and alternately laminated.

In a possible implementation of the second aspect, both a thickness of the indium layer and a thickness of the indium alloy layer range from 10 nm to 50 nm; and a thickness of the interleaved layer ranges from 200 nm to 1000 nm. Therefore, by setting the thickness of the indium layer and the thickness of the indium alloy layer to range from 10 nm to 55 nm, the shielding effect of the light shielding layer can be ensured while preventing the light shielding layer from conducting electricity, so that the light shielding layer are opaque and non-conductive, to ensure the shielding effect of the light shielding layer and avoid interference caused by the light shielding layer to the antenna signal of the electronic device. By setting the thickness of the interleaved layer to range from 200 nm to 1000 nm, the shielding effect of the light shielding layer can be ensured while reducing the thickness of the shielding part, and color types of the light shielding layer can be more abundant, so that the shielding part and the back cover can be better integrated.

In a possible implementation of the second aspect, the shielding part is disposed on a surface that is of the transparent cover plate and that faces the electrochromic film layer. The surface of the transparent cover plate is smooth and flat, so that the shielding part can be conveniently disposed on the surface of the transparent cover plate, thereby reducing processing difficulty of the shielding part, and improving processing efficiency and a production yield.

In a possible implementation of the second aspect, the shielding part further includes an underlayer, and the underlayer is disposed between the light shielding layer and the transparent cover plate The underlayer can improve adherence between the light shielding layer and the transparent cover plate, thereby reducing processing difficulty of the light shielding layer, and effectively preventing the light shielding layer from falling off.

In a possible implementation of the second aspect, the underlayer is a silicon-containing underlayer or a zirconia-containing underlayer. Therefore, the adherence between the light shielding layer and the transparent cover plate can be increased while reducing a thickness of the underlayer, thereby reducing impact of the underlayer on the overall thickness of the shielding part.

In a possible implementation of the second aspect, a thickness of the silicon-containing underlayer ranges from 1 nm to 7 nm, and a thickness of the zirconia-containing underlayer ranges from 5 nm to 30 nm. Therefore, the adherence between the light shielding layer and the transparent cover plate can be increased while reducing a thickness of the underlayer, thereby reducing impact of the underlayer on the overall thickness of the shielding part.

In a possible implementation of the second aspect, the shielding part further includes a protective layer, and the protective layer is disposed on a side that is of the light shielding layer and that is away from the transparent cover plate. The protective layer can protect the light shielding layer, to prevent the light shielding layer from being scratched and falling off.

In a possible implementation of the second aspect, the protective layer is a niobium oxide layer or a titanium oxide layer. The niobium oxide layer and titanium oxide layer have relatively high hardness, so that a protective effect of the protective layer can be improved.

In a possible implementation of the second aspect, a thickness of the protective layer ranges from 10 nm to 35 nm. Therefore, the light shielding layer can be effectively protected by using the protective layer, and impact of the protective layer on the overall thickness of the shielding part can be reduced.

In a possible implementation of the second aspect, the back cover further includes a decoration layer, and the decoration layer is disposed on a side that is of the electrochromic film layer and that is away from the transparent cover plate. Therefore, appearance expression of the back cover can be improved.

In a possible implementation of the second aspect, the decoration layer includes at least one of an optical film layer, a color layer, and a texture layer. Therefore, the back cover can have various light lusters, colors, and texture changes, to improve appearance expression of the back cover.

In a possible implementation of the first aspect, a color difference ΔEab between a color of the shielding part and a color of the decoration layer ranges from 0 to 5. Therefore, by controlling the color difference ΔEab between the color of the shielding part and the color of the decoration layer to be within 0 to 5, the color of the shielding part and the color of the decoration layer can be substantially the same, thereby improving an aesthetic appearance of the back cover.

A third aspect of embodiments of this application provides a screen, including a transparent cover plate, a display panel, and a shielding part. The display panel and the transparent cover plate are laminated. The shielding part is disposed between an edge part of the display panel and the transparent cover plate, and a thickness of the shielding part is less than 4 microns.

In the screen provided in this application, by setting the thickness of the shielding part to be less than 4 microns, a layer difference between the display panel and the transparent cover plate can be reduced while both a shielding effect of the shielding part and surface smoothness of the shielding part are considered: and further, when the display panel is adhered to the transparent cover plate, air bubbles between the display panel and the transparent cover plate can be eliminated, so that difficulty of laminating the display panel to the transparent cover plate is greatly reduced, thereby improving a production yield. In addition, an overall thickness of the screen is reduced, thereby facilitating a lightening and thinning design of an electronic device.

In a possible implementation of the third aspect, an orthographic projection that is of an edge part of an electrochromic film layer and that is on the transparent cover plate is located in an orthographic projection that is of the shielding part and that is on the transparent cover plate. In this way, the shielding part can effectively shield the edge part of the electrochromic film layer, to prevent the edge part of the electrochromic film layer from being exposed, thereby improving an aesthetic appearance of the electronic device.

In a possible implementation of the third aspect, the thickness of the shielding part is less than 1 micron.

In a possible implementation of the third aspect, the thickness of the shielding part is greater than or equal to 0.01 micron.

A fourth aspect of embodiments of this application provides a method for processing a back cover. The back cover includes a transparent cover plate and an electrochromic film layer, and the electrochromic film layer and the transparent cover plate are laminated. The processing method includes: forming a shielding part between the transparent cover plate and an edge part of the electrochromic film layer, by using a vacuum coating process or a water electroplating process, where a thickness of the shielding part is less than 4 microns.

In the method for processing a back cover provided in this application, the shielding part is formed by using a vacuum coating process or a water electroplating process, and the thickness of the shielding part is made to be less than 4 microns, so that a requirement for a shielding effect of the shielding part and a requirement for surface smoothness of the shielding part can be satisfied, a layer difference between the electrochromic film layer and the transparent cover plate is reduced: and further, when the electrochromic film layer is adhered to the transparent cover plate, air bubbles between the electrochromic film layer and the transparent cover plate can be eliminated, so that difficulty of laminating the electrochromic film layer to the transparent cover plate is greatly reduced, thereby improving a production yield. In addition, an overall thickness of the back cover is reduced, thereby facilitating a lightening and thinning design of the electronic device.

In a possible implementation of the fourth aspect, a region that is on the transparent cover plate and that is opposite to the edge part is a first region: and that the shielding part is formed between the transparent cover plate and the edge part includes: forming a shielding part on a surface that is of the first region and that faces the edge part, positioning the shielding part between the first region and the edge part.

In a possible implementation of the fourth aspect, the electrochromic film layer further includes a middle portion surrounded by the edge part, a region that is on the transparent cover plate and that is opposite to the middle portion is a second region, and before the shielding part is formed on the surface that is of the first region and that faces the edge part, the method further includes: forming a removable film layer on a surface that is of the second region and that faces the middle portion: and after a shielding part is formed on the surface that is of the first region and that faces the edge part, the method further includes: removing the removable film layer. Therefore, accuracy of a plating position of the shielding part can be improved, so that plating difficulty is reduced, thereby improving a production yield.

BRIEF DESCRIPTION OF DRAWINGS

FIG. 9b is an enlarged view of a circled part A in FIG. 9a:

FIG. 11b is an enlarged view of a circled part B in FIG. 11a;

FIG. 12b is an enlarged view of a circled part C in FIG. 12a:

DESCRIPTION OF REFERENCE NUMERALS

Figure 1:
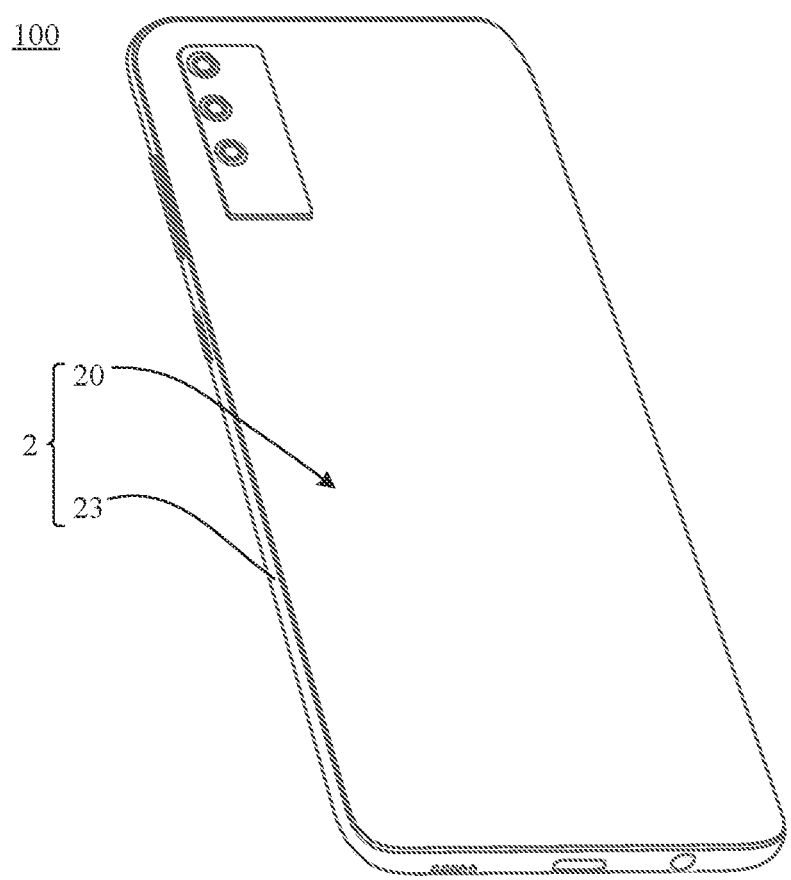
FIG. 1 is a schematic diagram of a structure of an electronic device according to some embodiments of this application.

100. Electronic device;
1. Screen; 11. Front cover plate; 12. Display panel;
2. Back case; 20. Back cover; 21. Transparent cover plate; 22. Electrochromic film layer; 221. First transparent conducting layer; 222. Electrochromic layer; 222a. Liquid crystal; 222b. Matrix; 223. Electrolyte layer; 224. Ion storage layer; 225. Second transparent conducting layer; 226. First substrate layer; 227. Second substrate layer; 22a. Edge part; 22b. Middle portion; 23. Frame; 24. Middle plate; 25. Decoration layer; 26. Shielding part; 26a. Light shielding layer; 26b. Underlayer; 26c. Protective layer; 27. Optically clear adhesive;
3. Circuit board; 31. Primary circuit board; 32. Secondary circuit board; 4. Connection structure.

DESCRIPTION OF EMBODIMENTS

In embodiments of this application, the terms "first", "second", "third", and "fourth" are used for descriptive purposes only, and cannot be construed as indicating or implying relative importance or implicitly indicating the quantity of technical features indicated. Therefore, the features defined with "first", "second", "third", and "fourth" may explicitly or implicitly include one or more of the features.

In embodiments of this application, the term "including", "containing" or any other variant thereof is intended to cover non-exclusive inclusion, so that a process, method, article or apparatus including a series of elements includes not only those elements, but also other elements not explicitly listed, or elements inherent to such a process, method, article or apparatus. Without further limitation, the element defined by the sentence "including a . . . " does not exclude that other identical elements are also present in the process, method, article or apparatus including the element.

In embodiments of this application, the term "and/or" is only used to describe an association relationship between associated objects, and indicates that three relationships may exist. For example, A and/or B may indicate the following: Only A exists, both A and B exist, and only B exists. The character "/" in the text usually indicates an "or" relationship between the associated objects.

This application provides an electronic device, where the electronic device includes a back cover of an electrochromic function. Specifically, this application provides an electronic device, a shielding part whose thickness is less than 4 microns is deposed between a transparent cover plate and an edge part of an electrochromic film layer, so that a layer difference between the electrochromic film layer and the transparent cover plate can be reduced while both the shielding effect of the shielding part and surface smoothness of the shielding part are considered: and further, when the electrochromic film layer is adhered to the transparent cover plate, air bubbles between the electrochromic film layer and the transparent cover plate can be eliminated, so that difficulty of laminating the electrochromic film layer to the transparent cover plate is greatly reduced, thereby improving a production yield.

Specifically, this electronic device 100 includes, but is not limited to, an electronic device 100 such as a mobile phone, a tablet personal computer, a laptop computer, a personal digital assistant (PDA), a personal computer, a notebook computer, a vehicle-mounted device, or a wearable device. A specific form of the electronic device 100 is not limited in embodiments of this application.

Figure 2:
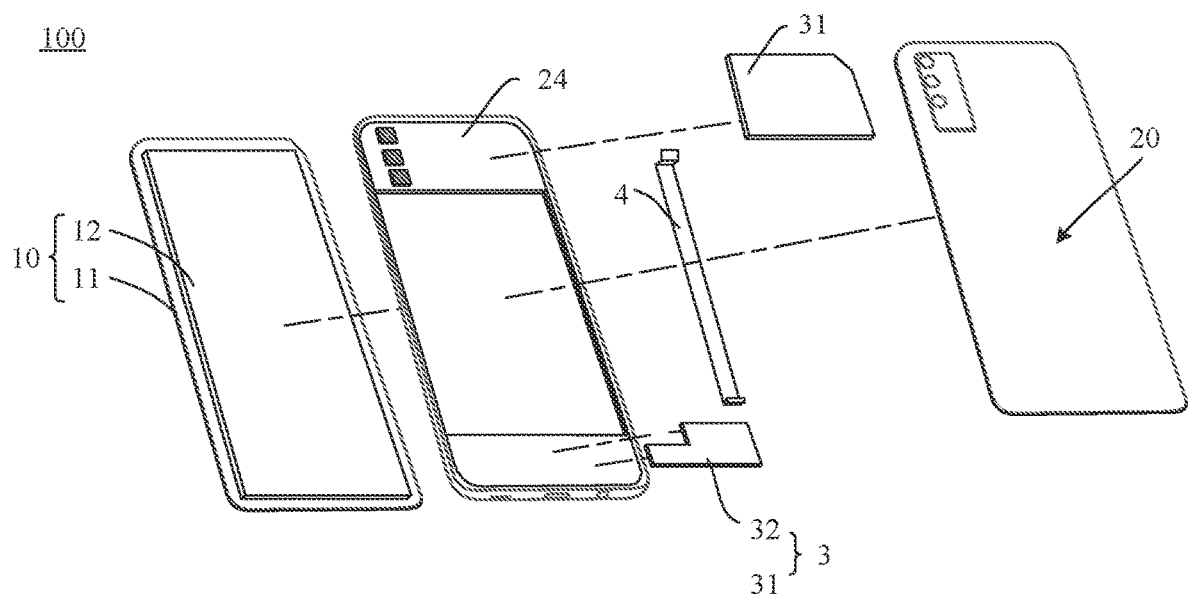
FIG. 2 is an exploded view of an electronic device in FIG. 1.

FIG. 1 is a schematic diagram of a structure of an electronic device 100 according to some embodiments of this application. FIG. 2 is an exploded view of an electronic device 100 in FIG. 1>. In this embodiment, the electronic device 100 is a phablet. Specifically, the electronic device 100 includes a screen 1, a circuit board, and a back case 2.

It can be understood that FIG. 1. FIG. 2 and the following related accompanying drawings show only some example components included in the electronic device 100. An actual shape, an actual size, an actual position, and an actual configuration of these components are not limited by FIG. 1, FIG. 2 and the following accompanying drawings. In some other embodiments, alternatively, the electronic device 100 may not include the screen 1.

The screen 1 is configured to display an image, a video, and the like. The screen 1 may include a transparent cover plate and a display panel 12. The transparent cover plate in the screen 1 may be the front cover plate 11 shown in FIG. 2. The front cover plate 11 and the display panel 12 are laminated and fixedly connected. The front cover plate 11 is mainly configured to protect the display panel 12 and prevent dust. A material of the front cover plate 11 includes, but is not limited to, glass. The display panel 12 may be a flexible display panel, or may be a rigid display panel. For example, the display panel 12 may be an organic light-emitting diode (OLED) display panel, an active-matrix organic light-emitting diode or an active-matrix organic light-emitting diode (AMOLED) display panel, a mini organic light-emitting diode (mini OLED) display panel, a micro organic light-emitting diode (micro OLED) display panel, a quantum dot light emitting diode (QLED) display panel, and a liquid crystal display (LCD).

The following describes a back case 2. The back case 2 is configured to protect an internal electronic device of the electronic device 100. The back case 2 includes a frame 23 and a back cover 20.

The back cover 20 may include a transparent cover plate 21, an electrochromic film layer 22, a shielding part 26, and a frame 23. The transparent cover plate 21 is located on a side that is of the display panel 12 and that is away from the front cover plate 11. The transparent cover plate 21, the front cover plate 11, and the display panel 12 are laminated. The frame 23 is located between the transparent cover plate 21 and the front cover plate 11, and the frame 23 is fastened on the transparent cover plate 21. The transparent cover plate 21 may be made of glass or a transparent resin material with specific hardness.

For example, the frame 23 may be fixedly connected to the transparent cover plate 21 by using adhesive. The frame 23 may alternatively be integrally formed with the transparent cover plate 21 that is, the frame 23 and the transparent cover plate 21 may be an integral structure. The front cover plate 11 is fastened to the frame 23. In some embodiments, the front cover plate 11 may be fastened to the frame 23 by using adhesive. The front cover plate 11, the transparent cover plate 21, and the frame 23 enclose an internal accommodation space of the electronic device 100, and the internal accommodation space accommodates the display panel 12, the circuit board 3, and the like.

Figure 3:
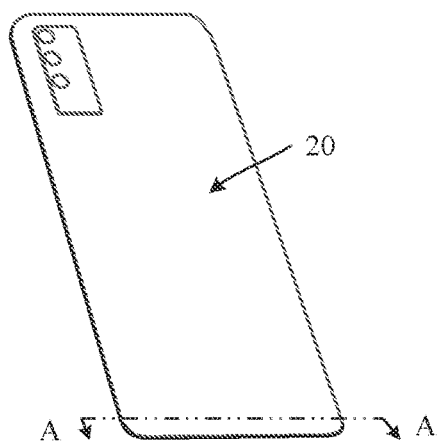
FIG. 3 is a perspective view of a back cover according to some embodiments of this application.
Figure 4:
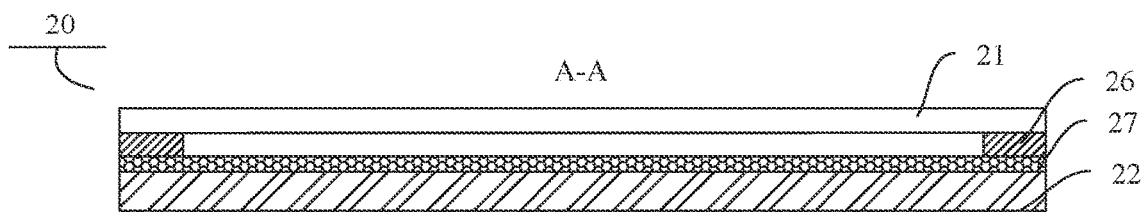
FIG. 4 is a sectional view taken along a line A-A in FIG. 3.

FIG. 3 is a perspective view of a back cover 20 according to some embodiments of this application. FIG. 4 is a sectional view taken along a line A-A in FIG. 3. An electrochromic film layer 22 and a transparent cover plate 21 are laminated. Specifically, the electrochromic film layer 22 may be located on a side that is of the transparent cover plate 21 and that faces a screen 1. For example, the electrochromic film layer 22 may be adhered to an inner surface of the transparent cover plate 21 by using optically clear adhesive (OCA) 27. The inner surface of the transparent cover plate 21 is a surface that is of the transparent cover plate 21 and that is close to an inner space of an electronic device 100.

It should be noted that the optically clear adhesive (OCA) 27 is special adhesive for bonding a transparent optical element (such as a lens). The optically clear adhesive is colorless and transparent, has light transmittance greater than 90%, good bonding strength, can be cured at a room temperature or a medium temperature, and has small curing shrinkage. In some embodiments, the optically transparent adhesive 27 is a special substrate-free double-sided adhesive with an optically transparent layer.

The electrochromic film layer 22 may undergo a stable and reversible color change under an action of an applied electric field, which is shown as a reversible change in color and transparency in appearance. In some embodiments, a magnitude of a voltage acting on the electrochromic film layer 22 may be changed, to change a color of the electrochromic film layer 22, so that an appearance of the electrochromic film layer 22 shows a different color. In some other embodiments, a magnitude of a voltage acting on the electrochromic film layer 22 may be changed, to change transparency of the electrochromic film layer 22, so that the electrochromic film layer 22 may show different appearance states such as a transparent state and a frosted state (colored state).

Figure 5:
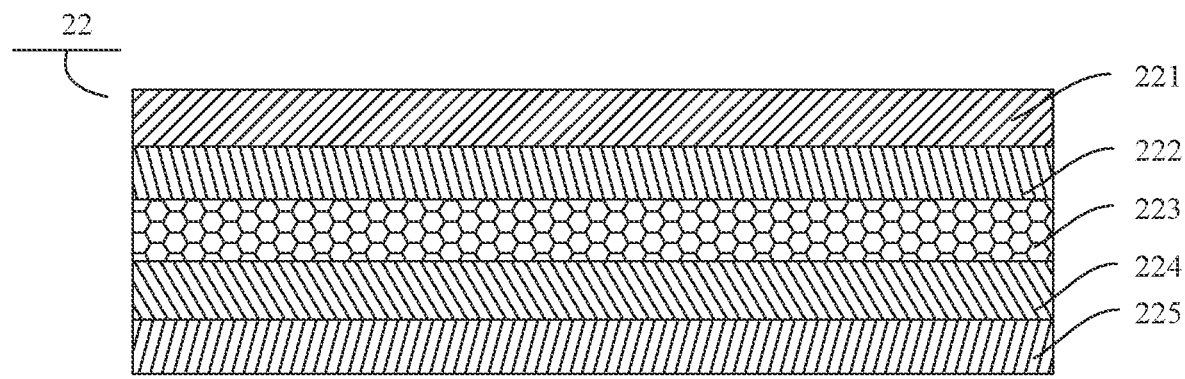
FIG. 5 is a sectional view of an electrochromic film layer according to some embodiments of this application.

FIG. 5 is a sectional view of an electrochromic film layer 22 of a back cover 20 according to an embodiment of this application. The electrochromic film layer 22 may include a first transparent conducting layer 221, an electrochromic layer 222, an electrolyte layer 223, an ion storage layer 224, and a second transparent conducting layer 225 that are laminated.

When the electrochromic film layer 22 works and the voltage is applied between the two transparent conducting layers (namely, the first transparent conducting layer 221 and the second transparent conducting layer 222), a material of the electrochromic layer 222 undergoes a redox reaction under an action of a specific voltage, and a color of the electrochromic layer 222 changes. The electrolyte layer 223 is used for conducting electricity. The ion storage layer 224 is configured to store corresponding counter ions and maintain a charge balance of an entire system when the material of the electrochromic layer 22 undergoes the redox reaction. The ion storage layer 224 may alternatively be made of an electrochromic material whose performance is opposite to a color change performance of the material of the preceding electrochromic layer 222, so that colors can be superimposed or complementary. For example, when the electrochromic layer 22 is made of an anodic oxidation color changing material, the ion storage layer 224 can be made of a cathodic reduction color changing material.

The first transparent conducting layer 221 and the second transparent conducting layer 225 may be made of indium tin oxide (ITO), tin oxide (SnO2), and antimony tin oxide (ATO), but are not limited thereto.

The electrochromic layer 222 is a core layer of the electrochromic film layer 22, and is also a layer at which color change reaction occurs. The material of the electrochromic layer 222 may fall into two types: an inorganic electrochromic material and an organic electrochromic material. The inorganic electrochromic material may be tungsten trioxide (WO3) or nickel oxide (NiO). The organic electrochromic material mainly includes polythiophenes and derivatives thereof, a viologen compound, a tetrathiafulvalene compound, a metal phthalocyanine compound, and the like.

The electrolyte layer 223 is made of a special conductive material, for example, a liquid electrolyte material containing a solution of lithium perchlorate, sodium perchlorate, or the like, or may be made of a solid electrolyte material.

The electrochromic film layer 22 in this embodiment may undergo a stable and reversible color change under an action of an applied electric field, and the technology of the electrochromic film layer 22 is mature and requires low costs.

Figure 6:
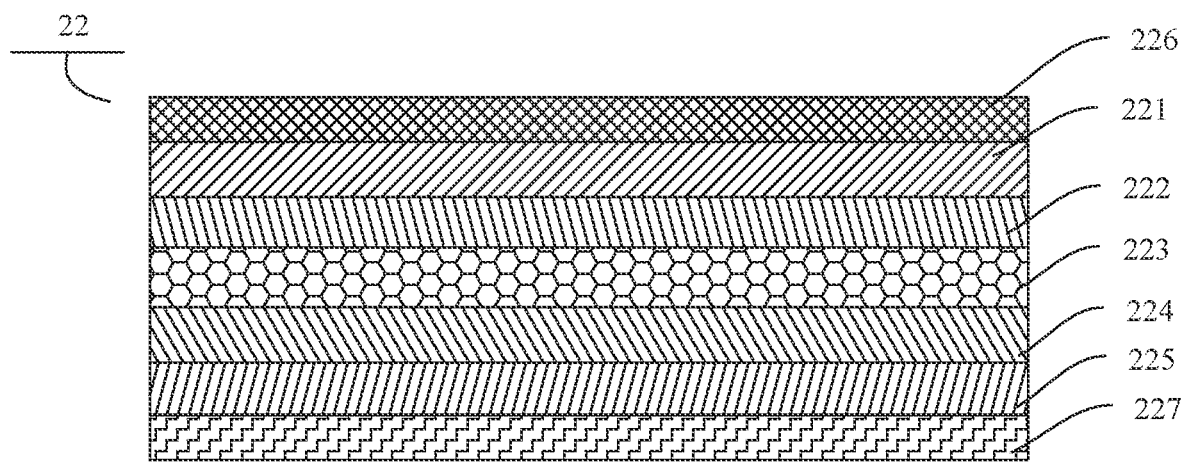
FIG. 6 is a sectional view of an electrochromic film layer according to some other embodiments of this application.

Further, FIG. 6 is a sectional view of another electrochromic film layer 22 of a back cover 20 according to an embodiment of this application. In addition to the first transparent conducting layer 221, the electrochromic layer 222, the electrolyte layer 223, the ion storage layer 224, and the second transparent conducting layer 225 in the electrochromic film layer 22 shown in FIG. 5, the electrochromic film layer 22 shown in FIG. 6 further includes a first substrate layer 226 and a second substrate layer 227. The first substrate layer 226 is disposed on a side that is of the first transparent conducting layer 221 and that is away from the electrochromic layer 222, and the second substrate layer 227 is disposed on a side that is of the second transparent conducting layer 225 and that is away from the electrochromic layer 222. The first substrate layer 226 and the second substrate layer 227 may be configured to support and protect the electrochromic layer 222. A material of the first substrate layer 226 and the second substrate layer 227 may be glass or plastic. In this way, by disposing the first substrate layer 226 and the second substrate layer 227, the electrochromic layer 222 can be supported and protected, so that structural stability and reliability of the electrochromic layer 222 is improved, thereby facilitating prolonging a service life of the electrochromic film layer 22, so as to reduce use costs.

When a specific voltage is applied between the first transparent conducting layer 221 and the second transparent conducting layer 225, a material of the electrochromic layer 222 undergoes a redox reaction under an action of the voltage. Therefore, a color of the electrochromic layer 222 changes, so that the electrochromic film layer 22 switches between a transparent state and a colored state. It can be understood that the material of the electrochromic layer 222 and a magnitude of the voltage between the first transparent conducting layer 221 and the second transparent conducting layer 225 may be changed, to change the color of the electrochromic layer 222, so that an appearance of the back cover 20 is more diversified.

Figure 7A:
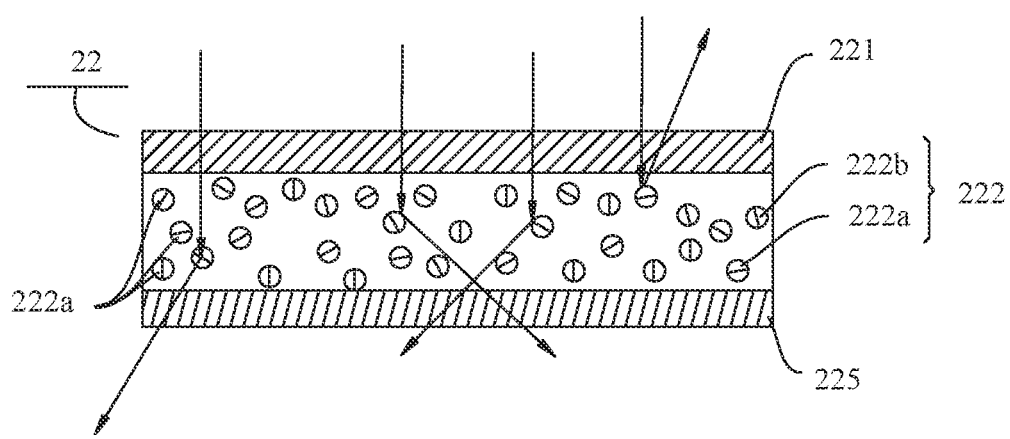
FIG. 7a is a sectional view of an electrochromic film layer to which no electric field is applied according to still some other embodiments of this application.
Figure 7B:
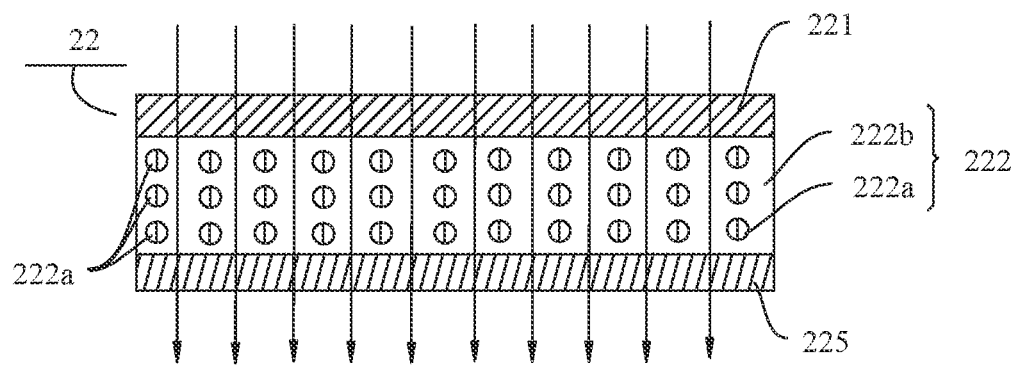
FIG. 7b is a sectional view of an electrochromic film layer to which an electric field is applied according to yet some other embodiments of this application.

FIG. 7a and FIG. 7b are sectional views of still another electrochromic film layer 22 of a back cover 20 according to an embodiment of this application. FIG. 7a shows a state when no electric field is applied to the electrochromic film layer 22. FIG. 7b shows a state when an electric field is applied to the electrochromic film layer 22. In this embodiment, the electrochromic film layer 22 includes a first transparent conducting layer 221, an electrochromic layer 222, and a second transparent conducting layer 225. The electrochromic layer 222 is a polymer dispersed liquid crystal (PDLC) dimming film. The electrochromic layer 222 includes a polymer dispersed liquid crystal (PDLC) and an organic solid polymer matrix. Specifically, a liquid crystal 222a is dispersed in an organic solid polymer matrix 222b (polymer network structure) as micron-sized liquid droplets.

As shown in FIG. 7a, when no electric field is applied, the liquid crystal 222a is freely oriented, and a refractive index of the liquid crystal 222a does not match a refractive index of the liquid crystal 222b. When passing through the substrate 222b, light is strongly scattered by the liquid crystal 222a to be in an opaque opalescent or translucent state, so that the electrochromic film layer 22 has specific haze (namely, a blur rate), and the electrochromic film layer 22 is in a colored state (may also be referred to as a frosted state). The electric field may be applied to adjust an optical axis orientation of the liquid crystal 222a, and when the refractive index of the liquid crystal 222a matches the refractive index of the substrate 222b, the light is not scattered by the liquid crystal 222a to be in a transparent state (as shown in FIG. 7b) when passing through the substrate 222b. Certainly, when the electric field disappears, the liquid crystal 222a returns to an original free orientation state.

In this way, the back cover 20 can exhibit different appearance states, to implement a color change effect of the back cover 20, thereby improving appearance expression of the back cover 20.

In this embodiment, a decoration layer can be disposed on a side that is of the electrochromic film layer 22 and that is away from a transparent cover plate 21, so that when the electrochromic layer 222 is in the transparent state, a decoration layer 25 can be seen from outside of the transparent cover plate 21, to enable an appearance of the back cover 20 to present an appearance surface of the decoration layer 25. Optionally, the decoration layer 25 includes at least one layer of an optical film layer, a color layer, and a texture layer. Therefore, the back cover 20 can have various light lusters, colors, and texture changes, thereby improving the appearance expression of the back cover 20.

Figure 8:
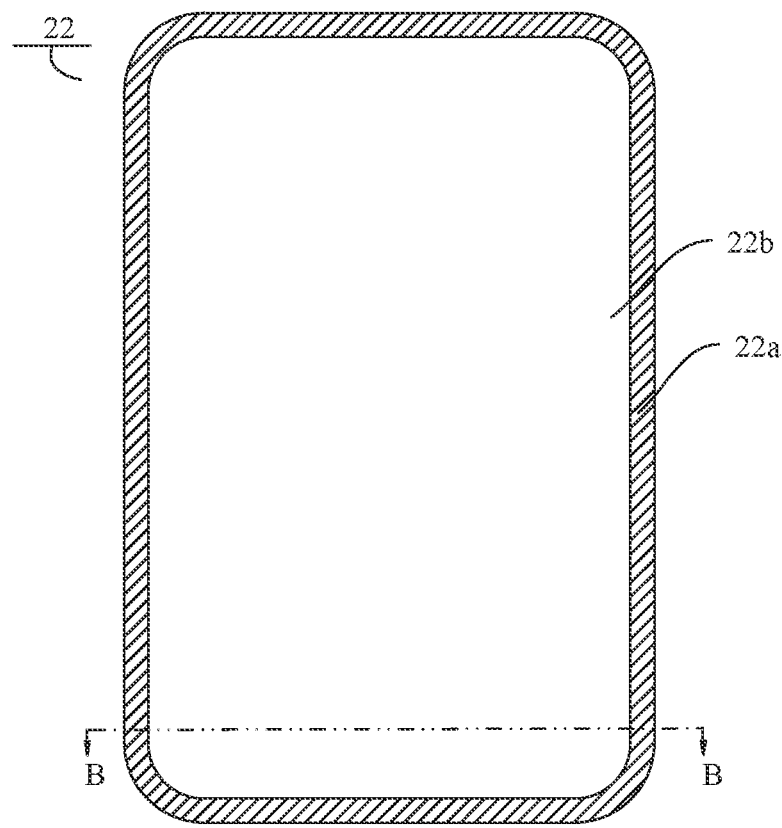
FIG. 8 is a top view of an electrochromic film layer according to some embodiments of this application.

FIG. 8 is a top view of an electrochromic film layer 22 according to an embodiment of this application. The electrochromic film layer 22 is relatively sensitive to moisture and oxygen. In some embodiments, an edge part 22a of the electrochromic film layer 22 is provided with an encapsulation region, to improve sealing performance of the electrochromic film layer 22. In some embodiments, the edge part 22a of the electrochromic film layer 22 is uneven in color due to impact of moisture, oxygen, or the like: or the edge part of the electrochromic film layer 22 is provided with a cabling region, so that the electrochromic film layer 22 cannot exhibit a color change effect. The electrochromic film layer 22 further includes a middle portion 22b surrounded by the edge part 22a, and the middle portion 22b can be switched between the transparent state and the colored state.

Figure 9A:
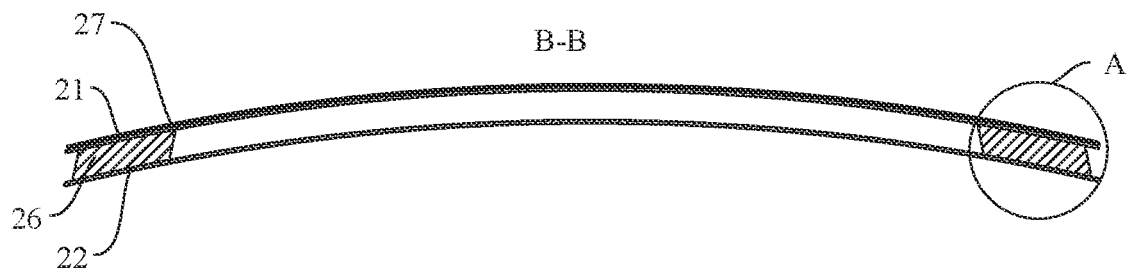
FIG. 9a is a sectional view taken along a line B-B in FIG. 8.
Figure 9B:
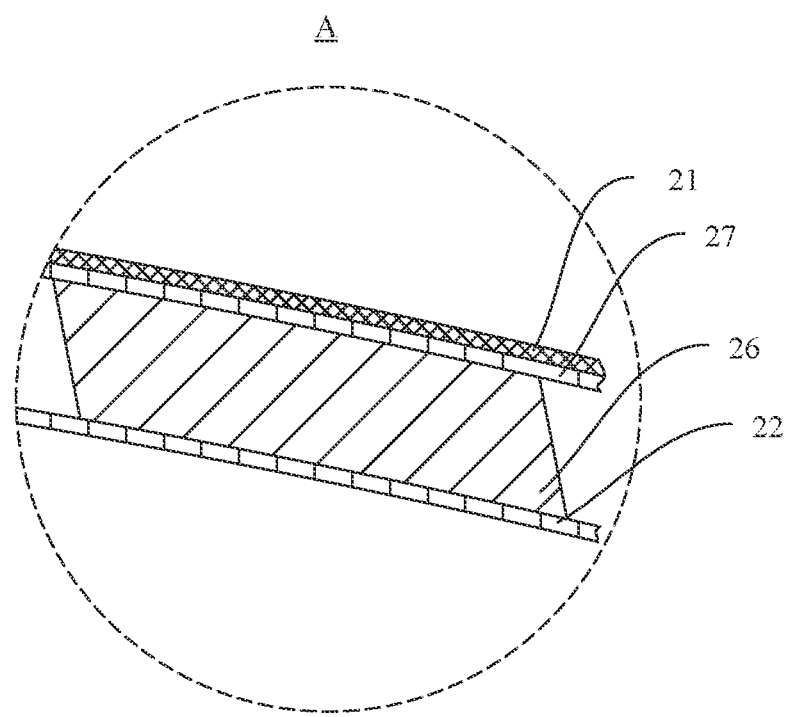

Referring to FIG. 9a and FIG. 9b, in some embodiments, a shielding part 26 is disposed between the transparent cover plate 21 and the edge part 22a of the electrochromic film layer 22, to shield the edge part 22a of the electrochromic film layer 22 and prevent the edge part 22a from being exposed. In this way, the edge part 22a can be shielded by the shielding part 26, to improve an aesthetic appearance of the back cover 20.

In some embodiments, an orthographic projection that is of the edge part 22a and that is on a transparent cover plate 21 is located in an orthographic projection that is of the shielding part 26 and that is on the transparent cover plate 21. In this way, the shielding part 26 can completely cover the edge part 22a, to improve a shielding effect of the shielding part 26 and prevent the edge part 22a from being exposed, thereby further improving the aesthetic appearance of the back cover 20.

In some embodiments, at least a part of an orthographic projection that is of an electrochromic region 22b and that is on the transparent cover plate 21 does not overlap the orthographic projection that is of the shielding part 26 and that is on the transparent cover plate 21. In other words, the at least a part of the electrochromic region 22b is not shielded by the shielding part 26. In this way, the back cover 20 can exhibit a color of the electrochromic region 22b, to ensure appearance expression of the back cover 20.

It can be understood that due to a processing error, the shielding part 26 may shield a part of the electrochromic region 22b during actual processing, so that a part of the orthographic projection that is of the electrochromic region 22b and that is on the transparent cover plate 21 does not overlap the orthographic projection that is of the shielding part 26 and that is on the transparent cover plate 21.

In some embodiments, referring to FIG. 8 and FIG. 9a, the shielding part 26 is formed by screen printing ink at the electrochromic film layer 22, and the shielding part 26 is configured to shield the edge part 22a. For another example, in some other embodiments, referring to FIG. 10, FIG. 11a, and FIG. 11b, the ink is transferred on an inner surface of the transparent cover plate 21 to form the shielding part 26 for shielding the edge part 22a. However, because particles of the ink are relatively large, to consider both a shielding effect of the shielding part 26 and surface smoothness of the shielding part 26, a thickness of the shielding part 26 formed by the transferring ink or the screen printing ink is usually large. For example, the thickness of the shielding part 26 formed by the screen printing ink at the electrochromic film layer shown in FIG. 9a ranges from 4 microns to 6 microns. The thickness of the shielding part 26 formed due to transferring ink on the inner surface of the transparent cover plate 21 shown in FIG. 11a ranges from 6 microns to 8 microns. When the shielding part 26 is disposed on the transparent cover plate 21, the thickness of the shielding part 26 refers to a dimension that is of the shielding part 26 and that is in a direction perpendicular to the transparent cover plate 21. When the shielding part 26 is disposed at the electrochromic film layer, the thickness of the shielding part 26 refers to a dimension that is of the shielding part 26 and that is in a direction perpendicular to the electrochromic film layer.

Because the thickness of the shielding part 26 is relatively large, a layer difference between the electrochromic film layer 22 and the transparent cover plate 21 is relatively large, and a relatively large step is formed between the electrochromic film layer 22 and the transparent cover plate 21. When the electrochromic film layer 22 is adhered to the transparent cover plate 21 by using optically clear adhesive 27, air bubbles may be easily generated between the electrochromic film layer 22 and the transparent cover plate 21 (especially at an edge of an inner surface of the shielding part 26). Consequently, an appearance of the back cover 20 is affected, difficulty of laminating the electrochromic film layer 22 to the transparent cover plate 21 is increased, and further a production yield of the back cover 20 is affected.

In addition, because the thickness of the shielding part 26 is relatively large, the layer difference between the electrochromic film layer 22 and the transparent cover plate 21 is relatively large. During a high-temperature test, the optically clear adhesive 27 may be easily separated from the transparent cover plate 21 under an action of stress. To improve strength of connection between the electrochromic film layer 22 and the transparent cover plate 21, and reduce air bubbles, a relatively thick optically clear adhesive 27 is used to connect the electrochromic film layer 22 and the transparent cover plate 21. Consequently a thickness of the back cover 20 is increased, and further, an overall thickness of an electronic device 100 is increased, which is not conducive to implementing a lightening and thinning design of the electronic device 100.

Figure 10:
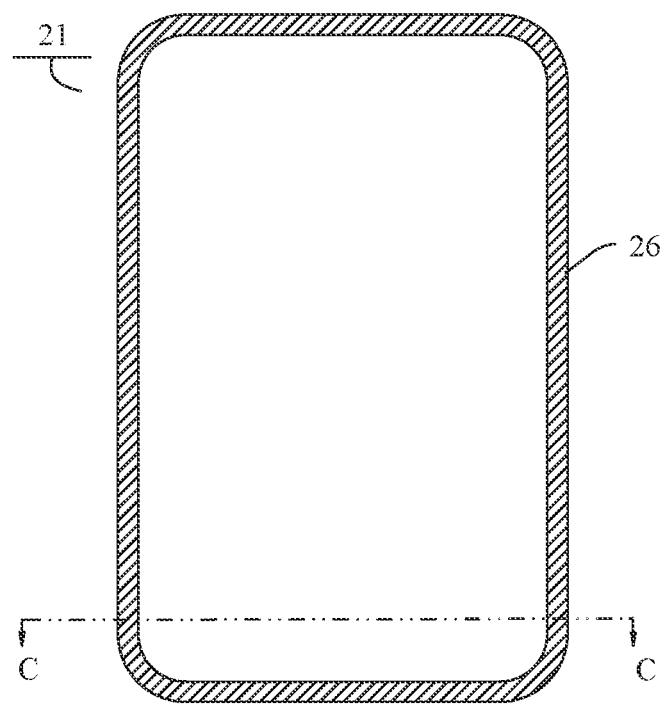
FIG. 10 is a top view of a transparent cover plate of a back cover according to some embodiments of this application.
Figure 11A:
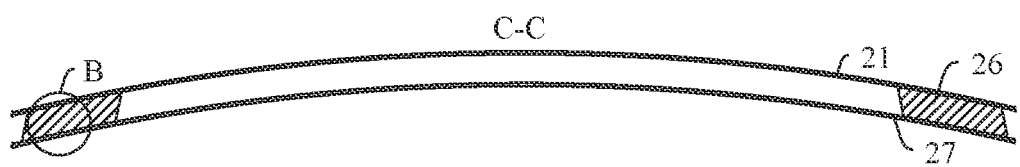
FIG. 11a is a sectional view taken along a line C-C in FIG. 10.
Figure 11B:
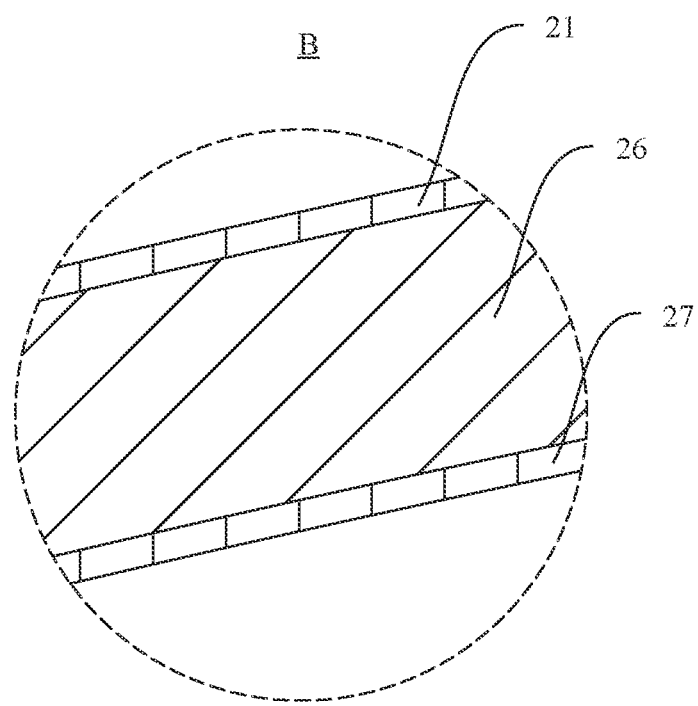
Figure 12A:
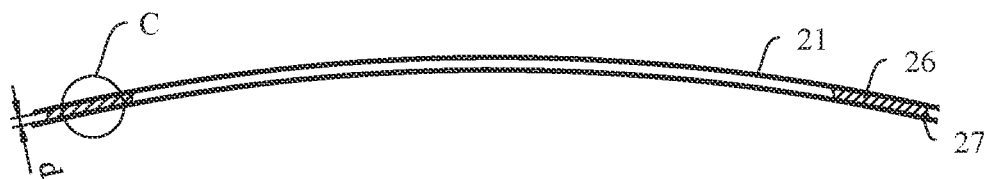
FIG. 12a is a sectional view of a transparent cover plate of a back cover according to some other embodiments of this application.
Figure 12B:
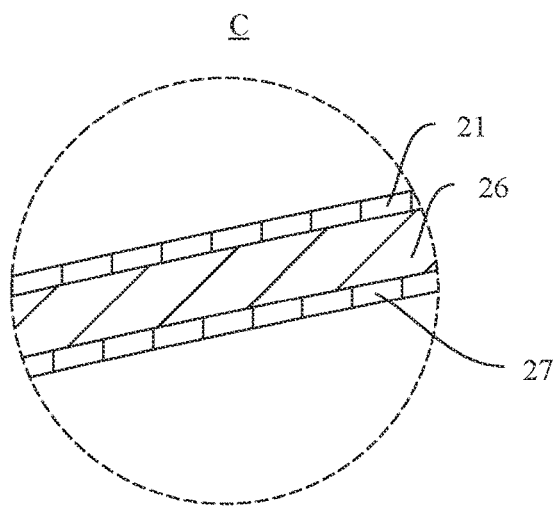

To avoid the forgoing problems, refer to FIG. 12a and FIG. 12b. FIG. 12a is a sectional view of a back cover 20 according to some other embodiments of this application. FIG. 12b is an enlarged view of a circled part C in FIG. 12a. A difference between the back cover 20 shown in this embodiment and the back cover 20 shown in FIG. 8 to FIG. 10 is that while both a shielding effect of the shielding part 26 and surface smoothness of the shielding part 26 are considered, a shielding part 26 for shielding an edge part 22a is disposed between a transparent cover plate 21 and the edge part 22a, so that a thickness d of the shielding part 26 is less than 4 microns. For example, the thickness of the shielding part 26 may be 3.5 microns, 3 microns, 2.8 microns, 2.5 microns, 2.2 microns, 2 microns, 1.8 microns, 1.6 microns, 1.5 microns, 1.2 microns, 1 micron, or the like. A specific thickness of the shielding part 26 may be determined based on a material of the shielding part 26, a quantity of layers, and the like.

In some embodiments of this application, the shielding part 26 may be formed between the transparent cover plate 21 and the edge part 22a of an electrochromic film layer 22 by using a vacuum coating process or a water electroplating process. The vacuum coating is a technology in which a physical method is used to produce a thin film material. In the vacuum coating, atoms of a material in a vacuum chamber are segregated from a heating source and hit onto a surface of an object to be plated. There are three forms of the vacuum coating: evaporation coating, sputtering coating, and ion coating. The water electroplating is to put a product to be electroplated into a chemical electroplating solution for electroplating. A film layer formed in the vacuum coating process or the water electroplating process has good compactness. Therefore, when the thickness of the shielding part 26 formed in the vacuum coating process or the water electroplating process is less than 4 microns, requirements for a shielding effect of the shielding part 26 and surface smoothness of the shielding part 26 can be satisfied.

In this way, by setting the thickness of the shielding part 26 to be less than 4 microns, a layer difference between the electrochromic film layer 22 and the transparent cover plate 21 can be reduced on the premise that both the shielding effect of the shielding part 26 and the surface smoothness of the shielding part 26 are considered: and further, when the electrochromic film layer 22 is adhered to the transparent cover plate 21, air bubbles between the electrochromic film layer 22 and the transparent cover plate 21 can be eliminated, to greatly reduce difficulty of laminating the electrochromic film layer 22 to the transparent cover plate 21, thereby improving a production yield. In addition, an overall thickness of the back cover 20 is reduced, thereby facilitating a lightening and thinning design of an electronic device 100.

In some further embodiments of this application, a thickness d of the shielding part 26 is less than or equal to 1 micron. For example, the thickness of the shielding part 26 may be 0.9 microns, 0.8 microns, 0.6 microns, 0.5 microns, 0.2 microns, 0.08 microns, 0.06 microns, 0.04 microns, 0.02 microns, 0.01 micron, or the like. Therefore, the layer difference between the electrochromic film layer 22 and the transparent cover plate 21 can be further reduced, and further, when the electrochromic film layer 22 is adhered to the transparent cover plate 21, the bubbles between the electrochromic film layer 22 and the transparent cover plate 21 can be eliminated, to greatly reduce the difficulty of laminating the electrochromic film layer 22 to the transparent cover plate 21, thereby improving a production yield. In addition, the overall thickness of the back cover 20 is reduced, thereby further facilitating a lightening and thinning design of the electronic device 100.

In some embodiments, the thickness d of the shielding part 26 is greater than or equal to 0.01 micron. Specifically, the thickness d of the shielding part 26 may satisfy 0.01 micron≤d<4 microns, or the thickness d of the shielding part 26 may satisfy 0.01 micron≤d≤1 micron. In this way, by further limiting the thickness of the shielding part 26, the thickness of the shielding part 26 is greater than or equal to 0.01 micron, so that the shielding effect of the shielding part 26 can be ensured, and the edge part 22a of the electrochromic film layer 22 is prevented from being exposed. Therefore, a layer difference between the electrochromic film layer 22 and the transparent cover plate 21 can be reduced while the shielding effect of the shielding part 26 is considered, the bubbles between the electrochromic film layer 22 and the transparent cover plate 21 can be eliminated, to greatly reduce the difficulty of laminating the electrochromic film layer 22 to the transparent cover plate 21, thereby improving a production yield. In addition, an overall thickness of the back cover 20 is reduced, thereby facilitating a lightening and thinning design of an electronic device 100.

Specifically, light transmittance of the shielding part 26 ranges from 0 to 50%. Further, the light transmittance of the shielding unit 26 may be 0, 10%, 15%, 20%, 25%, 30%, 35%, 40%, 45%, 50%, or the like. The light transmittance indicates an ability of light to pass through a medium. A greater light transmittance indicates higher translucency, and a smaller light transmittance indicates lower translucency. Therefore, by setting the light transmittance of the shielding part 26 to range from 0 to 50%, the shielding effect of the shielding part 26 can be ensured, and the edge part 22a of the electrochromic film layer 22 is prevented from being exposed.

In some embodiments, the shielding part 26 is a non-conductive member. In other words, the shielding part 26 may be an insulating member. For example, resistance of the shielding part 26 is not less than 5 megohms. Specifically, the resistance of the shielding part 26 ranges from 5 megohms to 20000 megohms. In this way, the shielding part 26 can be prevented from interfering with an antenna signal of the electronic device 100, thereby improving stability of the antenna signal of the electronic device 100.

It can be understood that the shielding part 26 may be disposed at any layer between the transparent cover plate 21 and the edge part 22a of the electrochromic film layer 22. For example, the shielding part 26 may be disposed on a surface of a side that is of the transparent cover plate 21 and that faces the electrochromic film layer 22. Alternatively, the shielding part 26 may be disposed on a surface of a side that is of the electrochromic film layer 22 and that faces the transparent cover plate 21. Alternatively, the shielding part 26 may be disposed at a first transparent conducting layer 221 of the electrochromic film layer 22. When an intermediate layer (for example, a first substrate layer 226) is disposed between the electrochromic film layer 22 and the transparent cover plate 21, the shielding part 26 may be disposed on any surface of the intermediate layer. Provided that the shielding part 26 can shield the edge part 22a of the electrochromic film layer 22, a specific position of the shielding part 26 is not limited in this application.

In some embodiments of this application, referring to FIG. 12a and FIG. 12b, the shielding part 26 is disposed on a surface that is of the transparent cover plate 21 and that faces the electrochromic film layer 22. Because the surface of the transparent cover plate 21 is smooth and flat, the shielding part 26 can be conveniently disposed on the surface of the transparent cover plate 21, thereby reducing processing difficulty of the shielding part 26, and improving processing efficiency and a production yield.

Figure 13:
FIG. 13 is a schematic diagram of an electronic device according to some embodiments of this application.

In some embodiments, refer to FIG. 13. The shielding part 26 includes a light shielding layer 26a. The light shielding layer 26a includes one or more of an indium layer, an indium alloy layer, and a first interleaved layer including at least two sub-layers of different refractive indexes that are successively and alternately laminated. It should be noted that "a plurality of" in this application means two or more.

For example, in some embodiments, the interleaved layer may be a first interleaved layer including a silicon dioxide layer and a titanium dioxide layer that are successively and alternately laminated, a second interleaved layer including a silicon dioxide layer and a niobium oxide layer that are successively and alternately laminated, or a third interleaved layer including a silicon dioxide layer and a tantalum oxide layer that are successively and alternately laminated. Each sub-layer in the interleaved layer may be one or more layers, and a thickness of each sub-layer in the interleaved layer may be the same, or may be different.

Specifically, the light shielding layer 26a may include one or more of the indium layer, the indium alloy layer, and the interleaved layer. When the light shielding layer 26a includes a plurality of the indium layer, the indium alloy layer, and the interleaved layer, the light shielding layer 26a may be a laminated structure in which a plurality of the indium layer, the indium alloy layer, and the interleaved layer are laminated.

For example, in some embodiments, the light shielding layer 26a is an indium layer or an indium alloy layer. Because light transmittance of the indium layer and the indium alloy layer is relatively small, and the light shielding layer 26a is disposed as the indium layer or the indium alloy layer, the thickness of the shielding part 26 may be reduced while ensuring the shielding effect of the shielding part 26.

Both a thickness of the indium layer and a thickness of the indium alloy layer may range from 10 nm to 55 nm. When the thickness of the indium layer or the indium alloy layer is less than 10 nm, light transmittance of the light shielding layer 26a is relatively large, and a requirement for shielding the edge part 22a of the electrochromic film layer 22 cannot be satisfied. Because indium is a semiconductor material, the indium layer or the indium alloy layer may be conductive when the thickness of the indium layer or the indium alloy layer is greater than 55 nm. Therefore, by setting the thickness of the indium layer and the thickness of the indium alloy layer to range from 10 nm to 55 nm, the shielding effect of the light shielding layer 26a can be ensured while preventing the light shielding layer 26a from conducting electricity, so that the light shielding layer 26a are opaque and non-conductive, to ensure the shielding effect of the light shielding layer 26a and avoid interference caused by the light shielding layer 26a to the antenna signal of the electronic device 100.

For another example, in some other embodiments, the light shielding layer 26a is the interleaved layer including the at least two sub-layers of different refractive indexes that are successively and alternately laminated. For example, the interleaved layer may be the first interleaved layer including the silicon dioxide layer and the titanium dioxide layer that are successively and alternately laminated, the second interleaved layer including the silicon dioxide layer and the niobium oxide layer that are successively and alternately laminated, or the third interleaved layer including the silicon dioxide layer and the tantalum oxide layer that are successively and alternately laminated. Each sub-layer in the interleaved layer may be one or more layers, and a thickness of each sub-layer in the interleaved layer may be the same, or may be different.

In this way, the light shielding layer 26a is disposed as the interleaved layer including the at least two sub-layers of different refractive indexes that are successively and alternately laminated. Therefore, the light shielding layer 26a are opaque and non-conductive, and each sub-layer will reflect and refract when light passes through the light shielding layer 26a, so that the light shielding layer 26a may have more abundant appearance effects, the color types of the light shielding layer 26a can be more abundant. As a result, the shielding part 26 and the back cover 20 may be better integrated, thereby further improving the aesthetic appearance of the back cover 20.

A thickness of the interleaved layer ranges from 200 nm to 1000 nm. Further, the thickness of the interleaved layer ranges from 200 nm to 500 nm. Specifically, the thickness of the interleaved layer may be, but is not limited to, 200 nm, 220 nm, 250 nm, 280 nm, 300 nm, 360 nm, 400 nm, 420 nm, 450 nm, 500 nm, or the like. Therefore, the shielding effect of the shielding part 26 can be ensured while reducing the thickness of the shielding part 26, and the color types of the light shielding layer 26a can be more abundant, so that the shielding part 26 and the back cover 20 can be better integrated.

For another example, in some other embodiments, the light shielding layer 26a is a laminated structure in which the interleaved layer and the indium or indium alloy layer are laminated. The interleaved layer may be disposed on a side that is of the indium or indium alloy layer and this is away from the transparent cover plate 21, or may be disposed on a side that is of the indium or indium alloy layer and that is close to the transparent cover plate 21. In this way, the light shielding layer 26a are opaque and non-conductive, and a color of the light shielding layer 26a can be adjusted based on a need, so that the shielding part 26 and the back cover 20 can be better integrated, thereby further improving the aesthetic appearance of the back cover 20.

Figure 14:
FIG. 14 is a schematic diagram of a shielding part according to some other embodiments of this application.

Further, in some other embodiments of this application, refer to FIG. 14. The shielding part 26 further includes an underlayer 26b, and the underlayer 26b is disposed between the light shielding layer 26a and the transparent cover plate 21. That is, during processing, the underlayer 26b may be formed on the transparent cover plate 21, and then the light-shielding layer 26a may be formed on a side that is of the underlayer 26b and that is away from the transparent cover plate 21. The underlayer 26b can improve adherence between the light shielding layer 26a and the transparent cover plate 21, thereby reducing processing difficulty of the light shielding layer 26a, and effectively preventing the light shielding layer 26a from falling off.

The underlayer 26b may be a silicon-containing underlayer or a zirconia-containing underlayer. A thickness of the silicon-containing underlayer layer may range from 1 nm to 7 nm, and therefore, the adherence between the light shielding layer 26a and the transparent cover plate 21 can be increased while reducing a thickness of the underlayer 26b, thereby reducing impact of the underlayer 26b on the overall thickness of the shielding part 26.

Figure 15:
FIG. 15 is a schematic diagram of a shielding part according to still some other embodiments of this application.

In still some other embodiments of this application, refer to FIG. 15. The shielding part 26 further includes a protective layer 26c, and the protective layer 26c is disposed on a side that is of the light shielding layer 26a and that is away from the transparent cover plate 21. The protective layer 26c can protect the light shielding layer 26a, to prevent the light shielding layer 26a from being scratched and falling off. The protective layer 26c is an oxide layer with relatively high surface hardness. For example, the protective layer 26c may be a niobium oxide layer or a titanium oxide layer. The niobium oxide layer and the titanium oxide layer have relatively high hardness, so that a protective effect of the protective layer 26c can be improved.

For example, when the light shielding layer 26a is an indium layer or an indium alloy layer, because hardness of indium and hardness of the indium alloy are relatively low, the light shielding layer 26a may be easily scratched by a foreign object. Consequently, an appearance and the shielding effect of the shielding part 26 are affected. In this case, the protective layer 26c with relatively high hardness is disposed on the side that is of the light shielding layer 26a and that is away from the light transmitting cover plate 21, so that the light shielding layer 26a can be effectively protected, thereby improving a production yield of the shielding part 26.

A thickness of the protective layer 26c may range from 10 nm to 35 nm. For example, the thickness of the protective layer 26c may be 10 nm, 15 nm, 18 nm, 20 nm, 25 nm, 30 nm, 32 nm, or the like. Therefore, the light shielding layer 26a can be effectively protected by using the protective layer 26c, and impact of the protective layer 26c on the overall thickness of the shielding part 26 can be reduced.

It can be understood that when surface hardness of the light shielding layer 26a is relatively high, the protective layer 26c may not be disposed. For example, in some embodiments, the light shielding layer 26a may be the first interleaved layer including the silicon dioxide layer and the titanium dioxide layer that are successively and alternately laminated, the second interleaved layer including the silicon dioxide layer and the niobium oxide layer that are successively and alternately laminated, or the third interleaved layer including the silicon dioxide layer and the tantalum oxide layer that are successively and alternately laminated. The surface hardness of the light shielding layer 26a is relatively high, and in this case, the protective layer 26c may not be disposed on the light shielding layer 26a.

For example, in some embodiments, the shielding part 26 includes the underlayer 26b, the light shielding layer 26a, and the protective layer 26c. Specifically, the underlayer 26b may be a silicon-containing underlayer, the light shielding layer 26a may be a light-impermeable and non-conductive indium layer or an indium alloy layer, and the protective layer 26c may be a niobium oxide layer.

In some other embodiments, the shielding part 26 includes the underlayer 26b and the light shielding layer 26a. Specifically, the underlayer 26b may be a zirconia-containing underlayer, and the light shielding layer 26a may be a first interleaved layer including the silicon dioxide layer and the titanium dioxide layer that are successively and alternately laminated.

In still some other embodiments, the shielding part 26 includes the underlayer 26b, two types of light shielding layers 26a, and the protective layer 26c. Specifically, the underlayer 26b may be a zirconia-containing underlayer: the first type of light shielding layer 26a may be a first interleaved layer, a second interleaved layer, or a third interleaved layer: the second type of light shielding layer 26a may be an indium layer or an indium alloy layer: and the protective layer 26c may be a niobium oxide layer or a titanium oxide layer. The first type of light shielding layer 26a is disposed between the underlayer 26b and the second type of light shielding layer 26a. In this embodiment, the underlayer 26b may be a silicon-containing reflective layer, and a thickness of the silicon-containing reflective layer ranges from 10 nm to 100 nm.

Figure 16:
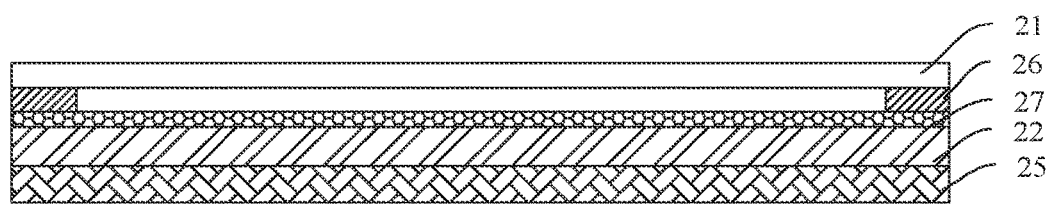
FIG. 16 is a sectional view of a back cover according to some other embodiments of this application.

FIG. 16 is a sectional view of a back cover 20 according to another embodiment of this application. The back cover 20 is substantially the same as the back cover 20 provided in FIG. 4, and a difference is that the back cover 20 shown in FIG. 16 further includes a decoration layer 25, and the decoration layer 25 disposed on a side that is of an electrochromic film layer 22 and that is away from a transparent cover plate 21. An orthographic projection that is of the decoration layer 25 and that is on the transparent cover plate 21 completely covers an orthographic projection that is of an electrochromic region 22b of the electrochromic film layer 22 and that is on the transparent cover plate 21. In an embodiment, the orthographic projection that is of the decoration layer 25 and that is on the transparent cover plate 21 and an orthographic projection that is of the electrochromic region 22b of the electrochromic layer 222 and that is on the transparent cover plate 21 are completely coincided. Certainly, in some other embodiments of this application, alternatively, the back cover 200 may not include the decoration layer 25.

It can be understood that, when the electrochromic layer 222 is in a transparent state, the decoration layer 25 can be seen from outside the transparent cover plate 21, so that an appearance of the back cover 20 presents an appearance surface of the decoration layer 25. Optionally, the decoration layer 25 includes at least one layer of an optical film layer, a color layer, and a texture layer. Therefore, the back cover 20 can have various light lusters, colors, and texture changes, thereby improving the appearance expression of the back cover 20.

In some embodiments of this application, the decoration layer 25 includes the optical film layer. It can be understood that the optical film layer is an optical medium material layer that propagates light through an interface of the optical film layer. Reflection and refraction of light passing through the optical film layer can be changed, so that the decoration layer 25 exhibits a specific gloss change, for example, exhibits different color gloss at different angles, and exhibits a metal texture. A material, a thickness, and a quantity of layers of the optical film layer may be changed, to change reflectivity, a refractive index, and light transmittance of the optical film layer, so as to satisfy requirements in different scenarios.

The material of the optical film layer may be an inorganic substance, or may be an organic substance. Optionally, the inorganic substance includes at least one of metal element, inorganic oxide, and inorganic fluoride. Optionally, the organic substance includes at least one of polyether, polyester, fluoropolymer, and silicon-containing polymer. If the material of the optical film layer is an organic substance, the optical film layer has good flexibility and bendability, and can be cut to obtain an optical film layer of a desired size.

In some embodiments of this application, the material of the optical film layer includes at least one of metal element, inorganic oxide, and inorganic fluoride. Further, the inorganic oxide includes at least one of metal oxide and non-metal oxide. Specifically, the metal element may be, but is not limited to, aluminum, yttrium, germanium, or the like; the inorganic oxide may be, but is not limited to, titanium dioxide, trititanium pentoxide, silicon dioxide, silicon monoxide, zirconium dioxide, aluminum oxide, tantalum pentoxide, or niobium monoxide: and the inorganic fluoride may be, but is not limited to, magnesium fluoride, calcium fluoride, or the like.

In some embodiments of this application, the thickness of the optical film layer ranges from 20 nm to 500 nm. By disposing the optical film layer with a nanometer-level thickness, a specific optical effect can be brought to the back cover 20 without affecting an overall thickness of the back cover 20. Further, the thickness of the optical film layer ranges from 50 nm to 420 nm. Specifically, the thickness of the optical film layer may be, but is not limited to, 80 nm, 95 nm, 180 nm, 250 nm, 300 nm, 360 nm, 400 nm, or the like.

In this application, the optical film layer may be a single-layer film structure or a multilayer film structure. If the optical film layer is a multilayer film structure, by controlling a material and thickness of each layer and cooperation between layers, a required function can be implemented. Optionally, the optical film layer includes at least two optical films of different refractive indexes that are successively and alternately laminated. In other words, when the optical film layer includes a plurality of optical films, refractive indexes of adjacent optical films are different. Further, the optical film layers are formed by at least two films of different refractive indexes that are periodically, successively and alternately laminated. Materials and thicknesses of the plurality of optical films may be the same, or may be different. Optical properties of the plurality of optical films are different. After light passes through the plurality of optical films, a surface of each optical film reflects and refracts, resulting in more abundant appearance effects.

Optionally, the thickness of the optical film ranges from 3 nm to 200 nm. Specifically, the optical film layer may include, but is not limited to, optical films of 2 layers, 3 layers, 4 layers, 5 layers, 6 layers, 7 layers, or 8 layers.

In some other embodiments of this application, the decoration layer 25 includes the color layer. It can be understood that the color layer may provide abundant visual effects to the decoration layer 25. Optionally, a thickness of the color layer ranges from 50 nm to 500 nm. In an embodiment, the color layer may be formed through screen printing and spraying color ink.

In some other embodiments of this application, the decoration layer 25 includes the texture layer. It can be understood that the appearance surface of the decoration layer 25 is provided with the texture layer, to exhibit a plurality of appearance expressions, for example, pattern effects such as a line, a texture, or a pattern may be exhibited. Optionally, a thickness of the texture layer ranges from 100 nm to 1000 nm. In an embodiment of this application, the texture layer is formed at the decoration layer 25 by using a UV transfer optical texture process. Optionally, the texture layer is formed at the decoration layer 25 by using high scratch resistance UV transfer adhesive, high hardness UV transfer adhesive, high elasticity UV transfer adhesive, or general-purpose UV transfer adhesive.

In some other embodiments of this application, the decoration layer 25 includes at least two or three of the optical film layer, the color layer, and the texture layer, to improve the appearance effect of the decoration layer 25. Specifically, it may be, but is not limited to, that a superposition of the optical film layer and the color layer may make color expression more significant, and lusters at different angles may be different: a superposition of the optical film layer and the texture layer can make the visual effect of the texture layer more prominent, and lusters at different angles are different: a superposition of the color layer and the texture layer may exhibit a color texture: and a superposition of the optical film layer, the color layer, and the texture layer exhibits a color texture, and lusters at different angles are different.

In some embodiments of this application, a color difference ΔEab between a color of the shielding part 26 and a color of the decoration layer 25 ranges from 0 to 5. In other words, the color difference ΔEab satisfies 0≤ΔEab≤5, and further, ΔEab satisfies 0≤ΔEab≤2. The color difference is almost invisible when observed with a naked eye. Therefore, by controlling the color difference ΔEab between the color of the shielding part 26 and the color of the decoration layer 25 to be within 0 to 5, the color of the shielding part 26 and the color of the decoration layer 25 can be substantially the same, thereby improving an aesthetic appearance of the back cover 20.

Using two color samples as an example, it is assumed that the two color samples are calibrated based on L, a and b, where L represents brightness, which ranges from 0 to 100, the lowest brightness is 0, and highest brightness is 100; a is a color change from green to red, which ranges from −128 to +128, pure green is negative 128, pure red is positive 128, and there are 256 grades between pure green and pure red: and b is a color change from blue to yellow, which ranges from −128 to +128, pure blue is negative 128, pure yellow is positive 128, and there are 256 levels between pure blue and pure yellow. Colors of the two color samples are separately calibrated as follows: color sample 1 is calibrated as L1, a1, and b1: and color sample 2 is calibrated as L2, a2, and b2. A color difference ΔEab between the two color samples can be calculated by using the following formula: a color difference ΔEab=[(ΔL x)2+(Δa x)2+(Δb x)2]½.

Referring back to FIG. 2, a circuit board 3 may include a primary circuit board 31 and a secondary circuit board 32. Certainly, in some embodiments of this application, the circuit board 3 may alternatively include only the primary circuit board 31. The primary circuit board 31 is configured to integrate a control chip. The control chip may be, for example, an application processor (AP), a double data rate synchronous dynamic random access memory and a universal flash storage (UFS). In some embodiments, the primary circuit board 31 and an electrochromic film layer 22 are electrically connected.

The primary circuit board 31 may be a rigid printed circuit board 3, may be a flexible printed circuit board 3, or may be a flexible-rigid printed circuit board 3. The primary circuit board 31 may be an FR-4 dielectric board, may be a Rogers dielectric board, may be an FR-4+Rogers mixed dielectric board, or the like. Here, FR-4 is a flame-resistant material grade code, and the Rogers dielectric board is a high frequency board.

The secondary circuit board 32 is used to integrate electronic devices such as a radio frequency front end of an antenna (such as a 5G antenna), a universal serial bus (USB) device, or an oscillator.

The secondary circuit board 32 may be a rigid printed circuit board 3, may be a flexible printed circuit board 3, or may be a flexible-rigid printed circuit board 3. The secondary circuit board 32 may be an FR-4 dielectric board, may be a Rogers dielectric board, may be an FR-4+Rogers mixed dielectric board, or the like.

The secondary circuit board 32 and the primary circuit board 31 are electrically connected through a connection structure 4, to implement data and signal transmission between the secondary circuit board 32 and the primary circuit board 31. The connection structure 4 may be a flexible printed circuit board 3 (FPC). In other embodiments, a connection structure 4 may alternatively be a conductor or an enamelled wire.

In some embodiments, referring to FIG. 2, the electronic device 100 further includes a middle plate 24. The middle plate 24 is fastened to a circumference of an inner surface of the frame 23. For example, the middle plate 24 may be fastened on the frame 23 through welding, or the middle plate 24 may be integrally formed with the frame 23. The middle plate 24 is used as a "skeleton" of a structure of the electronic device 100, and a circuit board may be fastened on the middle plate 24 through screwing, clamping, welding, or the like.

When the electronic device 100 does not include the middle plate 24, the circuit board 3 may be fastened, through screwing, snapping, soldering, or the like, on a surface that is of a display panel 12 and that faces a transparent cover plate 21.

In a back cover 20 of the electronic device 100 provided in this application, a thickness of a shielding part 26 is less than 4 microns, so that a layer difference between the electrochromic film layer 22 and the transparent cover plate 21 can be reduced while both a shielding effect of the shielding part 26 and surface smoothness of the shielding part 26 are considered; and further, when the electrochromic film layer 22 is adhered to the transparent cover plate 21, air bubbles between the electrochromic film layer 22 and the transparent cover plate 21 can be eliminated, to greatly reduce difficulty of laminating the electrochromic film layer 22 to the transparent cover plate 21, thereby improving a production yield. In addition, an overall thickness of the back cover 20 is reduced, thereby facilitating a lightening and thinning design of an electronic device 100.

The electronic device 100 provided in this embodiment of this application includes the back cover 20 described in the forgoing embodiment, so that both can resolve a same technical problem and achieve a same effect.

Some embodiments of this application further provide a screen 1, where the screen 1 includes a transparent cover plate, the display panel 12, and the shielding part 26. The transparent cover plate in the screen 1 may be the front cover plate 11 shown in FIG. 2. The display panel 12 and the transparent cover plate are laminated. Specifically, the display panel 12 may be located on a side that is of the transparent cover plate and that faces the back cover 20. For example, the display panel 12 may be adhered to the transparent cover plate by using optically clear adhesive 27.

The shielding part 26 is disposed between an edge part of the display panel 12 and the transparent cover plate: an orthographic projection that is of the edge part of the display panel 12 and that is on the transparent cover plate is located in an orthographic projection that is of the shielding part 26 and that is on the transparent cover plate: and a thickness d of the shielding part 26 is less than 4 microns.

For example, the thickness of the shielding part 26 may be 3.5 microns, 3 microns, 2.8 microns, 2.5 microns, 2.2 microns, 2 microns, 1.8 microns, 1.6 microns, 1.5 microns, 1.2 microns, 1 micron, or the like. A specific thickness of the shielding part 26 may be determined based on a material of the shielding part 26, a quantity of layers, and the like.

In some embodiments of this application, the shielding part 26 may be formed between the transparent cover plate and the edge part of the display panel 12 by using a vacuum coating process or a water electroplating process.

In this way, by setting the thickness of the shielding part 26 to be less than 4 microns, the layer difference between the display panel 12 and the transparent cover plate can be reduced while both the shielding effect of the shielding part 26 and the surface smoothness of the shielding part 26 are considered: and further, when the display panel 12 is adhered to the transparent cover plate, air bubbles between the display panel 12 and the transparent cover plate can be eliminated, to greatly reduce the difficulty of laminating the display panel 12 to the transparent cover plate, thereby improving the production yield. In addition, the overall thickness of the screen 1 is reduced, thereby facilitating the lightening and thinning design of the electronic device 100.

In some further embodiments of this application, the thickness d of the shielding part 26 is less than or equal to 1 micron. For example, the thickness of the shielding part 26 may be 0.9 microns, 0.8 microns, 0.6 microns, 0.5 microns, 0.2 microns, 0.08 microns, 0.06 microns, 0.04 microns, 0.02 microns, 0.01 micron, or the like. In this way, the layer difference between the display panel 12 and the transparent cover plate can be further reduced, and further, when the display panel 12 is adhered to the transparent cover plate, the bubbles between the electrochromic film layer 22 and the transparent cover plate can be eliminated, to greatly reduce the difficulty of laminating the display panel 12 to the transparent cover plate, thereby improving the production yield. In addition, the overall thickness of the screen 1 is reduced, thereby further facilitating the lightening and thinning design of the electronic device 100.

In some embodiments, the thickness d of the shielding part 26 is greater than or equal to 0.01 micron. Specifically, the thickness d of the shielding part 26 may satisfy $0.01 \text{ micron} \leq d < 4 \text{ microns}$, or the thickness d of the shielding part 26 may satisfy $0.01 \text{ micron} \leq d \leq 1 \text{ micron}$. In this way, by further limiting the thickness of the shielding part 26, the thickness of the shielding part 26 is greater than or equal to 0.01 micron, so that the shielding effect of the shielding part 26 can be ensured, and the edge part of the display panel 12 is prevented from being exposed. Therefore, the layer difference between the display panel 12 and the transparent cover plate can be reduced while the shielding effect of the shielding part 26 is considered, the bubbles between the display panel 12 and the transparent cover plate can be eliminated, to greatly reduce the difficulty of laminating the display panel 12 to the transparent cover plate, thereby improving a production yield. In addition, the overall thickness of the screen 1 is reduced, thereby facilitating the lightening and thinning design of the electronic device 100.

An embodiment of this application further provides a method for processing a back cover 20. The back cover 20 includes a transparent cover plate 21 and an electrochromic film layer 22, and the electrochromic film layer 22 and the transparent cover plate 21 are laminated. The back cover 20 in this embodiment may be the back cover 20 in the forgoing embodiment, but is not limited thereto.

The method includes: forming a shielding part 26 between the transparent cover plate 21 and an edge part 22a of the electrochromic film layer 22 by using a vacuum coating process or a water electroplating process, where a thickness d of the shielding part 26 satisfies d<4 microns.

In some embodiments, an orthographic projection that is of the edge part 22a of the electrochromic film layer 22 and that is on the transparent cover plate 21 is located in an orthographic projection that is of the shielding part 26 and that is on the transparent cover plate 21. In this way, the shielding part 26 can completely cover the edge part 22a, to improve a shielding effect of the shielding part 26 and prevent the edge part 22a from being exposed, thereby further improving the aesthetic appearance of the back cover 20.

The vacuum coating is a technology for producing a thin film material by using a physical method. In the vacuum coating, atoms of a material in a vacuum chamber are segregated from a heating source and hit onto a surface of an object to be plated. There are three forms of the vacuum coating: evaporation coating, sputtering coating, and ion coating. The water electroplating is to put a product to be electroplated into a chemical electroplating solution for electroplating. A film layer formed in the vacuum coating process or the water electroplating process has good compactness. Therefore, when the thickness of the shielding part 26 formed in the vacuum coating process or the water electroplating process is less than 4 microns, requirements for a shielding effect of the shielding part 26 and surface smoothness of the shielding part 26 can be satisfied. Therefore, a layer difference between the electrochromic film layer 22 and the transparent cover plate 21 can be reduced, and further, when the electrochromic film layer 22 is adhered to the transparent cover plate 21, air bubbles between the electrochromic film layer 22 and the transparent cover plate 21 can be eliminated, to greatly reduce difficulty of laminating the electrochromic film layer 22 to the transparent cover plate 21, thereby improving a production yield. In addition, an overall thickness of the back cover 20) is reduced, thereby facilitating a lightening and thinning design of an electronic device 100.

It can be understood that the shielding part 26 may be disposed at any layer between the transparent cover plate 21 and the edge part 22a of the electrochromic film layer 22. For example, the shielding part 26 may be disposed on a surface of a side that is of the transparent cover plate 21 and that faces the electrochromic film layer 22. Alternatively, the shielding part 26 may be disposed on a surface of a side that is of the electrochromic film layer 22 and that faces the transparent cover plate 21. Alternatively, when an intermediate layer is disposed between the electrochromic film layer 22 and the transparent cover plate 21, the shielding part 26 may be disposed on any surface of the intermediate layer. Provided that the shielding part 26 can shield the edge part 22a of the electrochromic film layer 22, a specific position of the shielding part 26 is not limited in this application.

Specifically, a region that is on the transparent cover plate 21 and that is opposite to the edge part 22a of the electrochromic film layer 22 is a first region. That the shielding part 26 is formed between the transparent cover plate 21 and the edge part 22a includes: forming the shielding part 26 on a surface that is of the first region and that faces the edge part 22a, and positioning the shielding part 26 between the first region and the edge part 22a. The region that is on the transparent cover plate 21 and that is opposite to the edge part 22a is a region in which an orthographic projection that is of the edge part 22a and that is on the transparent cover plate 21 is located.

In this way, the edge part 22a can be shielded by the shielding part 26 that is formed in the first region, thereby improving the aesthetic appearance of the back cover 20. In addition, a surface of the transparent cover plate 21 is smooth and flat, so that the shielding part 26 can be conveniently formed on the transparent cover plate 21, thereby reducing processing difficulty of the shielding part 26, and improving production efficiency and a production yield.

In some embodiments, the electrochromic film layer 22 further includes a middle portion 22b surrounded by the edge part 22a, and a region that is on the transparent cover plate 21 and that is opposite to the middle portion 22b is a second region: and before the shielding part 26 is formed on the surface that is of the first region and that faces the edge part 22a, the method further includes:

forming a removable film layer on a surface that is of the second region and that faces the middle portion 22b; and after the shielding part 26 is formed on the surface that is of the first region and that faces the edge part 22a, the method further includes: removing the removable film layer.

The region that is on the transparent cover plate 21 and that is opposite to the electrochromic region 22b (namely, the second region) is a region in which an orthographic projection that is of the electrochromic region 22b and that is on the transparent cover plate 21 is located.

Specifically, during processing, the removable film layer may be plated or affixed on the second region before the shielding part 26 is formed on the first region, and the removable film layer may be removed after the shielding part 26 is formed on the first region on the transparent cover plate 21.

Therefore, accuracy of a position of the shielding part 26 can be improved, so that plating difficulty is reduced, thereby improving the production yield.

In the following embodiments, a specific method for processing the back cover 20 is described based on an example in which the shielding part 26 is disposed on the surface of the side that is of the transparent cover plate 21 and that faces the electrochromic film layer 22.

Embodiment 1

Figure 17:
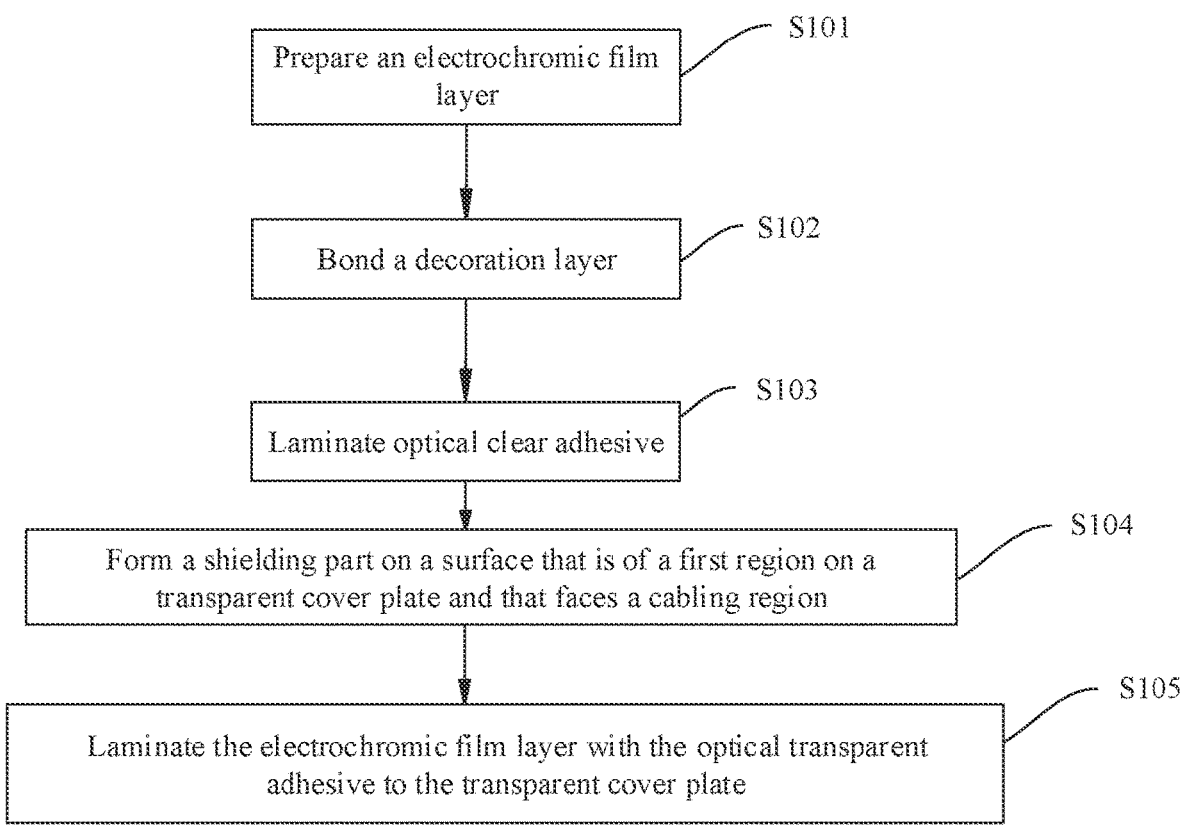
FIG. 17 is a flowchart of some methods for processing a back cover according to this application.

As shown in FIG. 17, a method for processing a back cover 20 in this embodiment includes step S101 to S105.

S101: Prepare an electrochromic film layer 22.

Specifically, the electrochromic film layer 22 is of a sandwich structure, upper and lower layers of the electrochromic film layer 22 are a first transparent conducting layer 221 and a second transparent conducting layer 225, respectively, a surface of a side of the first transparent conducting layer 221 is covered with a first substrate layer 226, a surface of a side of the second transparent conducting layer 225 is covered with a second substrate layer 227, and an electrochromic layer 222 may be a PDLC dimming film. In a preparation process, two transparent conducting layers on two sides of the PDLC dimming film and the PDLC dimming film may be sequentially laminated after precise alignment is performed in a roll-to-roll method, and then UV-curing is performed on a laminated structure, to obtain the electrochromic film layer 22.

S102: Bond a decoration layer 25.

The decoration layer 25 with optically clear adhesive (OCA) 27 is adhered to the second substrate layer 227 of the electrochromic film layer 22, where the decoration layer 25 may include one or more of an optical film layer, a texture layer, and a color layer.

S103: Laminate the optically clear adhesive 27.

The optically clear adhesive 27 ranging from 15 microns to 30 microns is laminated to the first substrate layer 226 of the electrochromic film layer 22.

S104: Form a shielding part 26 on a surface that is of the first region on the transparent cover plate 21 and that faces an edge part 22a of the electrochromic film layer 22.

The shielding part 26 is plated (for example, vacuum coating) on the surface that is of the first region on the transparent cover plate 21 and that faces the edge part 22a of the electrochromic film layer 22. The shielding part 26 may include an underlayer 26b, a light shielding layer 26a, and a protective layer 26c. Specifically, in a plating process, the underlayer 26b may be first plated on the surface that is of the first region and that faces the edge part 22a of the electrochromic film layer 22. The underlayer 26b may be a silicon-containing underlayer 26b, and a thickness of the silicon-containing underlayer 26b ranges from 1 nm to 7 nm. Then the light shielding layer 26a is plated on a surface of a side that is of the underlayer 26b and that is away from the transparent cover plate 21. The light shielding layer 26a may be an indium layer or an indium alloy layer. The indium layer or the indium alloy layer is opaque and non-conductive, and a thickness of the indium layer or the indium alloy layer ranges from 10 nm to 55 nm. Next, the protective layer 26c is plated on a surface of a side that is of the light shielding layer 26a and that is away from the underlayer 26b. The protective layer 26c may be an oxide layer such as a niobium oxide layer or a titanium oxide layer, and a thickness of the protective layer 26c ranges from 10 nm to 35 nm.

In a specific plating process, a removable film layer may be plated or affixed on a surface that is of the second region on the transparent cover plate 21 and that faces an electrochromic region 22b before plating the shielding part 26, and the removable film layer may be removed after the shielding part 26 is plated on the first region.

S105: Laminate the electrochromic film layer 22 with optically clear adhesive to the transparent cover plate 21, to form the back cover 20.

Embodiment 2

A method for processing a back cover 20 in this embodiment is substantially the same as the processing method in Embodiment 1, and a difference is that a material of a shielding part 26 in this embodiment is different. The shielding part 26 in this embodiment includes an underlayer 26b and a light shielding layer 26a. The underlayer 26b is a zirconia-containing underlayer, and a thickness of the zirconia-containing underlayer ranges from 5 nm to 30 nm. The light shielding layer 26a is a first interleaved layer including a silicon dioxide layer and a titanium dioxide layer that are successively and alternately laminated.

In a plating process, the underlayer 26b is first plated on a surface that is of a first region on the transparent cover plate 21 and that faces an edge part 22a of an electrochromic film layer 22, and the underlayer 26b is a silicon-containing underlayer. Then the light shielding layer 26a is plated on a side that is of the underlayer 26b and that is away from the transparent cover plate 21.

Embodiment 3

A method for processing a back cover in this embodiment is substantially the same as the processing method in Embodiment 1, and a difference is that a material of a shielding part 26 in this embodiment is different. The shielding part 26 in this embodiment includes an underlayer 26b, two types of light shielding layers 26a, and a protective layer 26c. The underlayer 26b is a zirconia-containing underlayer, and a thickness of the zirconia-containing underlayer ranges from 5 nm to 30 nm. The first type of light shielding layer is a first interleaved layer including a silicon dioxide layer and a titanium dioxide layer that are successively and alternately laminated, a second interleaved layer including a silicon dioxide layer and a niobium oxide layer that are successively and alternately laminated, or a third interleaved layer including a silicon dioxide layer or a tantalum oxide layer that are successively and alternately laminated. Thicknesses of the first interleaved layer, the second interleaved layer, and the third interleaved layer range from 200 nm to 1000 nm. The second type of light shielding layer is located on a side that is of the first light type of shielding layer and that is away from the underlayer 26b, and the second type of light shielding layer is an indium layer or an indium alloy layer. A thickness of the indium layer or the indium alloy layer ranges from 10 nm to 55 nm. The protective layer 26c is an oxide layer such as a niobium oxide layer or a titanium oxide layer, and a thickness of the protective layer 26c ranges from 10 nm to 35 nm.

In a plating process, the underlayer 26b is first plated on a surface that is of a first region on a transparent cover 21 and that faces an edge part 22a of an electrochromic film layer 22, then the first type of light-shielding layer is plated on a surface of a side that is of the underlayer 26b and that is away from the transparent cover 21: next, the second type of light-shielding layer is plated on a surface of a side that is of the first light-shielding layer and that is away from the underlayer 26b: and finally, the protective layer 26c is plated on a surface of a side that is of the second light-shielding layer and that is away from the underlayer 26b.

Embodiment 4

A method for processing a back cover 20 in this embodiment is substantially the same as the processing method in Embodiment 3, and a difference is that a material of a shielding part 26 in this embodiment is different. A shielding part 26 in this embodiment includes an underlayer 26b, two types of light shielding layers 26a, and a protective layer 26c. The underlayer 26b is a silicon-containing reflective layer, and a thickness of the silicon-containing reflective layer ranges from 10 nm to 100 nm. The first type of light shielding layer is a first interleaved layer including a silicon dioxide layer and a titanium dioxide layer that are successively and alternately laminated, and a thickness of the first interleaved layer ranges from 200 nm to 1000 nm. The second type of light shielding layer is located on a side that is of the first light type of shielding layer and that is away from the underlayer 26*b*, and the second type of light shielding layer is an indium layer or an indium alloy layer. A thickness of the indium layer or the indium alloy layer ranges from 10 nm to 55 nm. The protective layer 26*c* is an oxide layer such as a niobium oxide layer or a titanium oxide layer, and a thickness of the protective layer 26*c* ranges from 10 nm to 35 nm.

An electronic device 100 provided in this application includes a back cover 20 with an electrochromic function. Specifically, when a user uses the electronic device 100, a state of an electrochromic film layer 22 can be manually switched based on an actual need, to switch an appearance state of the back cover 22. For example, the user may switch the state of the electrochromic film layer 22 by using a volume key, a power key, or tapping the back cover, to switch the electrochromic film layer 22 between a transparent state and a frosted state (also referred to as a colored state), so that the back cover 20 exhibits different appearance states.

For example, the user may switch the state of the electrochromic film layer 22 based on light intensity in an actual use scenario. Specifically, the user may switch the electrochromic film 22 to the frosted state in a bright (for example, daytime) use environment, and switch the electrochromic film 22 to the transparent state in a dark (for example, nighttime) use environment. Certainly, the user may also switch the electrochromic film 22 to the transparent state in the bright (for example, the daytime) use environment, and switch the electrochromic film 22 to the frosted state in the dark (for example, the nighttime) use environment.

It can be understood that the user may switch the state of the electrochromic film layer 22 when the electronic device 100 is awakened (for example, when there is an incoming call alert, a short message alert, an alarm alert, a missed call, unread information, or the like) and when the electronic device 100 enters a standby state, by setting a program of the electronic device 100.

For example, when the electronic device 100 is awakened, a processor of the electronic device 100 may apply a voltage to the electrochromic film layer 22, so that the electrochromic film layer 22 is in a transparent state. When the electronic device 100 enters the standby state, the processor may cancel the voltage applied to the electrochromic film layer 22, so that the electrochromic film layer 22 is in the frosted state. In this way, when the electronic device 100 is in a mute state, the user may be alerted that the electronic device 100 is awakened, by switching the appearance state of the back cover, so that the user can receive a message, an incoming call, and the like in a timely manner.

In description of this specification, specific features, structures, materials or characteristics described may be combined in any one or more embodiments or examples in a suitable manner.

Finally, it should be noted that the foregoing embodiments are only used to illustrate the technical solutions of this application, but are not used to limit this application. Although this application has been described in detail with reference to the foregoing embodiments, it should be understood by a person of ordinary skill in the art that the technical solutions described in the foregoing embodiments may still be modified, or some technical features thereof are equivalently replaced. These modifications or replacements do not make the essence of the corresponding technical solutions depart from the spirit and scope of the technical solutions of embodiments of this application.

What is claimed is:

1. An electronic device comprising a back cover, wherein the back cover comprises:
   a transparent cover plate;
   an electrochromic film layer, wherein the electrochromic film layer and the transparent cover plate are laminated; and
   a shielding part, wherein the shielding part is disposed between an edge part of the electrochromic film layer and the transparent cover plate, and a thickness of the shielding part is less than 4 microns;
   wherein the shielding part comprises a light shielding layer, and the light shielding layer comprises an indium layer and an indium alloy layer, wherein a thickness of the indium layer ranges from 10 nm to 50 nm, and wherein a thickness of the indium alloy layer ranges from 10 nm to 50 nm;
   wherein the shielding part is disposed on a surface that is of the transparent cover plate and that faces the electrochromic film layer, wherein the shielding part further comprises an underlayer, and the underlayer is disposed between the light shielding layer and the transparent cover plate, wherein the underlayer is a silicon-containing underlayer or a zirconia-containing underlayer; and
   wherein the light shielding layer further comprises an interleaved layer and the interleaved layer is one of:
     a first interleaved layer comprising a silicon dioxide layer and a titanium dioxide layer that are successively and alternately laminated, or
     a second interleaved layer comprising a silicon dioxide layer and a niobium oxide layer that are successively and alternately laminated, or
     a third interleaved layer comprising a silicon dioxide layer and a tantalum oxide layer that are successively and alternately laminated.

2. The electronic device according to claim 1, wherein the thickness of the shielding part is less than or equal to 1 micron.

3. The electronic device according to claim 1, wherein the thickness of the shielding part is greater than or equal to 0.01 micron.

4. The electronic device according to claim 1, wherein light transmittance of the shielding part ranges from 0 to 50%.

5. The electronic device according to claim 1, wherein the shielding part is a non-conductive member.

6. The electronic device according to claim 1, wherein resistance of the shielding part is greater than or equal to 5 megohms.

7. The electronic device according to claim 1, wherein a thickness of the silicon-containing underlayer ranges from 1 nm to 7 nm, and a thickness of the zirconia-containing underlayer ranges from 5 nm to 30 nm.

8. The electronic device according to claim 1, wherein the shielding part further comprises a protective layer, and the protective layer is disposed on a side that is of the light shielding layer and that is away from the transparent cover plate.

9. The electronic device according to claim 8, wherein the protective layer is a niobium oxide layer or a titanium oxide layer.

10. The electronic device according to claim 8, wherein a thickness of the protective layer ranges from 10 nm to 35 nm.

11. The electronic device according to claim 1, wherein the electronic device further comprises a decoration layer, and the decoration layer is disposed on a side that is of the electrochromic film layer and that is away from the transparent cover plate.

12. The electronic device according to claim 1, wherein the light shielding layer comprises the first interleaved layer, and wherein a thickness of the first interleaved layer ranges from 200 nm to 1000 nm.

13. The electronic device according to claim 1, wherein the light shielding layer comprises the second interleaved layer, and wherein a thickness of the second interleaved layer ranges from 200 nm to 1000 nm.

14. The electronic device according to claim 1, wherein the light shielding layer comprises the third interleaved layer, and wherein a thickness of the third interleaved layer ranges from 200 nm to 1000 nm.

15. A method for processing a back cover, wherein the back cover comprises a transparent cover plate and an electrochromic film layer, the electrochromic film layer and the transparent cover plate are laminated, and the method comprises:
    forming a shielding part between the transparent cover plate and an edge part of the electrochromic film layer, by using a vacuum coating process or a water electroplating process, wherein a thickness of the shielding part is less than 4 microns;
    wherein the shielding part comprises a light shielding layer, and the light shielding layer comprises one or more of: an indium layer and an indium alloy layer, wherein a thickness of the indium layer ranges from 10 nm to 50 nm, and wherein a thickness of the indium alloy layer ranges from 10 nm to 50 nm;
    wherein the shielding part is disposed on a surface that is of the transparent cover plate and that faces the electrochromic film layer, wherein the shielding part further comprises an underlayer, and the underlayer is disposed between the light shielding layer and the transparent cover plate, wherein the underlayer is a silicon-containing underlayer or a zirconia-containing underlayer; and
    wherein the light shielding layer further comprises an interleaved layer and the interleaved layer is one of:
        a first interleaved layer comprising a silicon dioxide layer and a titanium dioxide layer that are successively and alternately laminated, or
        a second interleaved layer comprising a silicon dioxide layer and a niobium oxide layer that are successively and alternately laminated, or
        a third interleaved layer comprising a silicon dioxide layer and a tantalum oxide layer that are successively and alternately laminated.

16. The method according to claim 15, wherein a region that is on the transparent cover plate and that is opposite to the edge part is a first region, and wherein the forming the shielding part between the transparent cover plate and the edge part comprises:
    forming a shielding part on a surface that is of the first region and that faces the edge part; and
    positioning the shielding part between the first region and the edge part.

17. The method according to claim 16, wherein the electrochromic film layer further comprises a middle portion surrounded by the edge part, a region that is on the transparent cover plate and that is opposite to the middle portion is a second region, and before the forming the shielding part on the surface that is of the first region and that faces the edge part, the method further comprises:
    forming a removable film layer on a surface that is of the second region and that faces the middle portion;
    wherein after the forming the shielding part on the surface that is of the first region and that faces the edge part, the method further comprises:
    removing the removable film layer.

* * * * *

UNITED STATES PATENT AND TRADEMARK OFFICE
CERTIFICATE OF CORRECTION

PATENT NO. : 12,271,073 B2  
APPLICATION NO. : 17/923140  
DATED : April 8, 2025  
INVENTOR(S) : Chengjie Gao Page 1 of 1

It is certified that error appears in the above-identified patent and that said Letters Patent is hereby corrected as shown below:

On the Title Page

Applicant, item (71): "Honor Device Co., Ltd., Guangdong (CN)" should read -- Honor Device Co., Ltd., Shenzhen (CN) --.

Signed and Sealed this  
Thirteenth Day of May, 2025

Coke Morgan Stewart  
*Acting Director of the United States Patent and Trademark Office*